(12) United States Patent
Yasutake et al.

(10) Patent No.: US 12,538,753 B2
(45) Date of Patent: Jan. 27, 2026

(54) SUBSTRATE PROCESSING APPARATUS

(71) Applicant: SCREEN Holdings Co., Ltd., Kyoto (JP)

(72) Inventors: Yosuke Yasutake, Kyoto (JP); Ryo Muramoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 752 days.

(21) Appl. No.: 17/880,827

(22) Filed: Aug. 4, 2022

(65) Prior Publication Data

US 2023/0096580 A1    Mar. 30, 2023

(30) Foreign Application Priority Data

Sep. 24, 2021   (JP) .................................. 2021-155617

(51) Int. Cl.
    *H01L 21/68*      (2006.01)
    *B05B 7/16*       (2006.01)
    *H01L 21/67*      (2006.01)
    *H01L 21/687*     (2006.01)

(52) U.S. Cl.
    CPC .. *H01L 21/68764* (2013.01); *H01L 21/67023* (2013.01)

(58) Field of Classification Search
    USPC .............................. 118/52, 612, 55, 319, 320
    See application file for complete search history.

(56) References Cited

U.S. PATENT DOCUMENTS

2006/0054656 A1   3/2006  Narita et al. ...................... 228/9
2014/0060423 A1*  3/2014  Nakai ................. B05C 11/1039
                                                   118/320

2015/0279721 A1   10/2015  Kikumoto et al.
2016/0329220 A1   11/2016  Nakai
2017/0271177 A1   9/2017  Kikumoto et al.
(Continued)

FOREIGN PATENT DOCUMENTS

CN        213541273 U    6/2021
JP        H09-217183 A   8/1997
(Continued)

OTHER PUBLICATIONS

English Translation KR-20210110688-A (Year: 2021).*
(Continued)

*Primary Examiner* — Yewebdar T Tadesse
(74) *Attorney, Agent, or Firm* — OSTROLENK FABER LLP

(57) ABSTRACT

In a substrate processing apparatus for supplying a processing liquid onto a substrate being rotated, to thereby process the substrate, an upper support body which is a placement member is separably placed on a lower support body for supporting the substrate. The upper support body is moved up and down by an up-and-down moving part. The upper support body includes a first contact part outside an outer periphery of the substrate in a radial direction. When a second contact part of the up-and-down moving part goes up, the second contact part comes into contact with the first contact part, to thereby move the upper support body up. When the second contact part goes down, the upper support body is placed on the lower support body and the second contact part is separated from the first contact part, and in this state, the lower support body is rotatable.

12 Claims, 14 Drawing Sheets

(56) References Cited

U.S. PATENT DOCUMENTS

2019/0019710 A1  1/2019  Kakinoki et al.
2021/0023592 A1  1/2021  Nakano

FOREIGN PATENT DOCUMENTS

| | | | |
|---|---|---|---|
| JP | 2014-067780 | A | 4/2014 |
| JP | 2015-188009 | A | 10/2015 |
| JP | 2016-039282 | A | 3/2016 |
| JP | 2016-192518 | A | 11/2016 |
| JP | 2017-168774 | A | 9/2017 |
| JP | 2018-049985 | A | 3/2018 |
| JP | 2019-021675 | A | 2/2019 |
| KR | 20140084746 | A * | 7/2014 |
| KR | 20210110688 | A * | 9/2021 |
| TW | 200420481 | A | 10/2004 |
| TW | 202013588 | A | 4/2020 |
| TW | 202105491 | A | 2/2021 |
| WO | WO 2015/107838 | A1 | 7/2015 |

OTHER PUBLICATIONS

English Translation KR-20140084746A (Year: 2014).*
Notice of Allowance dated Jul. 10, 2023, issued in corresponding Taiwanese Patent Application No. 111129677.
Decision to Grant a Patent issued Mar. 27, 2025 for corresponding Japanese Patent Application No. 2021-155617. English translation attached.
Decision to Grant issued in corresponding Korean Application No. 10-2022-0099291, mailed on Jan. 2, 2024 with machine translation.
Notice of Allowance for corresponding Chinese Patent Application No. 202210884878.0 issued on May 28, 2025.

\* cited by examiner

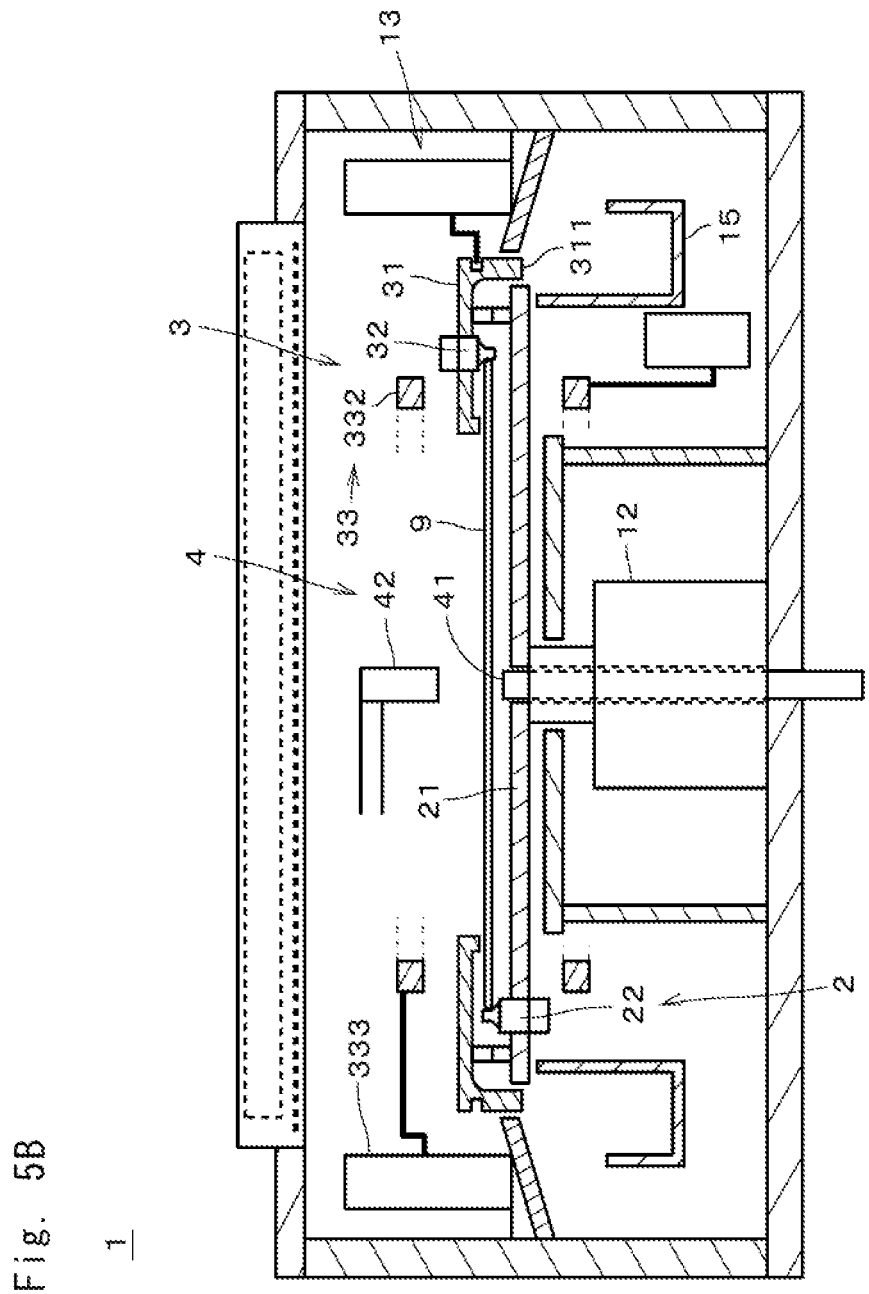

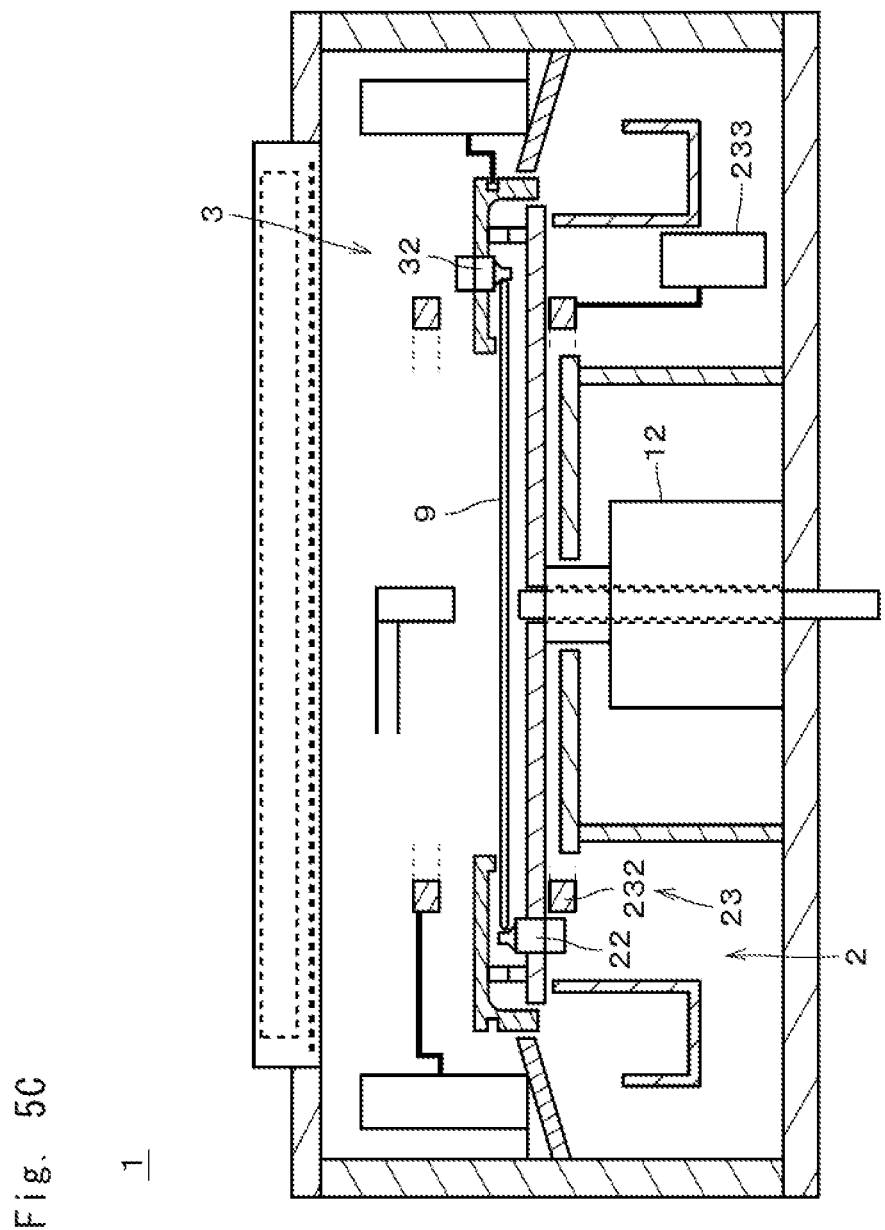

SUBSTRATE PROCESSING APPARATUS

TECHNICAL FIELD

The present invention relates to a technique for supplying a processing liquid onto a substrate to process the substrate.

CROSS REFERENCE TO RELATED APPLICATION

The present application claims the benefit of priority to Japanese Patent Application No. 2021-155617 filed on Sep. 24, 2021, the content of which is incorporated herein by reference in its entirety.

BACKGROUND ART

In a process of manufacturing a substrate such as a semiconductor substrate, a glass substrate, or the like (hereinafter, referred to simply as a "substrate"), conventionally, performed is a processing in which a processing liquid is supplied to the substrate while the substrate is rotated. In this case, well known is a technique in which a member opposed to the substrate is disposed above the substrate and a processing is performed while this member is rotated together with the substrate. In Japanese Patent Application Laid Open Gazette No. 2019-021675 (hereinafter, referred to as "Document 1"), for example, an opposed member is placed on a spin base and the opposed member faces an upper surface of a substrate. In Japanese Patent Application Laid Open Gazette No. 2016-039282 (hereinafter, referred to as "Document 2"), a top plate faces an upper surface of a substrate and is rotated together with the substrate.

Conventionally, the member opposed to the upper surface of the substrate is supported from above a center of the substrate as described in Documents 1 and 2. For this reason, a space above the center of the substrate can be used to the extent of not disturbing the support by the member above the substrate.

SUMMARY OF INVENTION

In a case where a member covering at least part above a substrate is placed on a support part for supporting the substrate, it is an object of the present invention to move this member up and down with a simple structure and use a space above the substrate for various uses.

A first aspect of the present invention is intended for a substrate processing apparatus for supplying a processing liquid onto a substrate to process the substrate, and the substrate processing apparatus includes a support part for directly or indirectly supporting a substrate in a horizontal position, a rotating part for rotating the support part around a central axis oriented in an up-and-down direction, a placement member which is separably placed on the support part and covers above at least an outer edge portion of the substrate supported by the support part, an up-and-down moving part for moving the placement member up and down relative to the support part, and a processing liquid supply part for supplying a processing liquid onto an upper surface or a lower surface of the substrate supported by the support part, and in the substrate processing apparatus, the placement member includes a first contact part which is contactable with the up-and-down moving part in the up-and-down direction outside an outer periphery of the substrate supported by the support part in a radial direction, the up-and-down moving part includes a second contact part extending toward the first contact part of the placement member from an outward portion in the radial direction and an up-and-down-move driving part for moving the second contact part up and down, when the second contact part is moved up by the up-and-down-move driving part, the second contact part comes into contact with the first contact part to separate the placement member upward from the support part, when the second contact part is moved down by the up-and-down-move driving part, the placement member is placed on the support part to separate the second contact part from the first contact part, and the support part is rotatable in a state where the first contact part and the second contact part are separated from each other.

In the present invention, it is possible to move the placement member up and down with a simple structure and use a space above the substrate for various uses.

According to a second aspect of the present invention, in the substrate processing apparatus of the first aspect, the position of the first contact part in a height direction is not higher than 150 mm from an upper surface of the support part in a state where the placement member is placed on the support part.

According to a third aspect of the present invention, in the substrate processing apparatus of the first or second aspect, the placement member has an annular shape.

According to a fourth aspect of the present invention, in the substrate processing apparatus of any one of the first to third aspects, the first contact part and the second contact part include position deviation preventing structures which are fitted to each other when these come into contact with each other.

According to a fifth aspect of the present invention, the substrate processing apparatus of any one of the first to third aspects, when the first contact part comes into contact with the second contact part, an annular surface of the first contact part around the central axis comes into contact with the second contact part.

According to a sixth aspect of the present invention, the substrate processing apparatus of any one of the first to fifth aspects further includes an annular cover disposed outside the placement member in the radial direction in a still state, and in the substrate processing apparatus, an upper portion of the annular cover gets closer to an outer peripheral surface of the placement member while going inward in the radial direction, and the up-and-down-move driving part is provided on the annular cover.

These and other objects, features, aspects and advantages of the present invention will become more apparent from the following detailed description of the present invention when taken in conjunction with the accompanying drawings.

BRIEF DESCRIPTION OF DRAWINGS

FIG. 5B is a view showing another state of the substrate processing apparatus;

FIG. 5C is a view showing still another state of the substrate processing apparatus;

DESCRIPTION OF EMBODIMENTS

Figure 1:
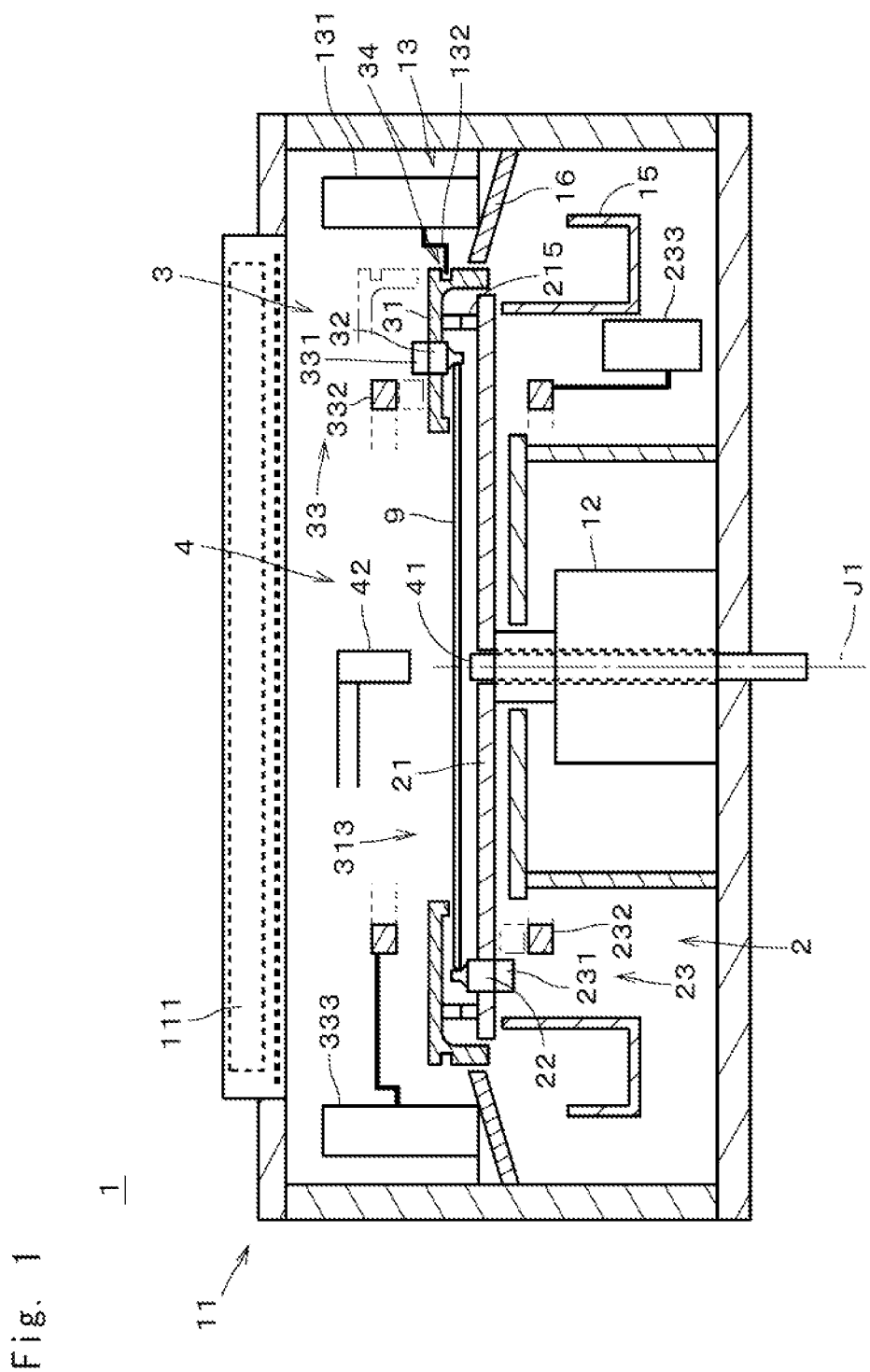
FIG. 1 is a side elevational view showing a configuration of a substrate processing apparatus in accordance with one preferred embodiment.

FIG. 1 is a side elevational view showing a configuration of a substrate processing apparatus 1 in accordance with one preferred embodiment of the present invention. The substrate processing apparatus 1 is a single-substrate processing apparatus for processing a semiconductor substrate 9 (hereinafter, referred to simply as a "substrate 9") one by one. The substrate processing apparatus 1 supplies a processing liquid onto the substrate 9 and thereby performs a processing. FIG. 1 shows part of the configuration of the substrate processing apparatus 1 in a cross section. Further, parallel hatch lines representing the cross section will be omitted in details as appropriate.

The substrate processing apparatus 1 includes a housing 11, a lower support part 2, an upper support part 3, a rotating part 12, an up-and-down moving part 13, a liquid receiving part 15, an annular cover 16, a processing liquid supply part 4, and a control part which is not shown. The housing 11 accommodates the lower support part 2, the upper support part 3, the rotating part 12, the up-and-down moving part 13, the liquid receiving part 15, the annular cover 16, the processing liquid supply part 4, and the like. FIG. 1 shows the housing 11 in a cross section. Atop cover portion of the housing 11 is provided with an airflow generation part 111 which supplies gas to an internal space thereof and thereby forms an airflow flowing downward (i.e., downflow). As the airflow generation part 111, for example, used is an FFU (Fan Filter Unit).

The control part is disposed outside the housing 11 and controls the lower support part 2, the upper support part 3, the rotating part 12, the up-and-down moving part 13, the processing liquid supply part 4, and the like. The control part includes an ordinary computer including, for example, a processor, a memory, an input/output part, and a bus. The bus is a signal circuit for connecting the processor, the memory, and the input/output part. The memory stores therein a program and various information. The processor executes various processings (e.g., numerical calculation) while using the memory and the like in accordance with the program and the like stored in the memory. The input/output part includes a keyboard and a mouse which receive an input from an operator, a display which displays thereon an output or the like from the processor, and a transmission part for transmitting the output or the like from the processor.

The lower support part 2 supports the substrate 9 in a horizontal position. Though the lower support part 2 directly supports the substrate 9 in the present preferred embodiment, as described later, the lower support part 2 may indirectly support the substrate 9. The phrase "indirectly support the substrate 9" refers to supporting of the substrate 9 through a member which is separably or inseparably connected to the lower support part 2. The lower support part 2 includes a lower support body 21, a plurality of lower holding members 22, and a lower hold-driving part 23. FIG. 1 shows one lower holding member 22 on the left side. The lower support body 21 faces a lower surface of the substrate 9. Specifically, an upper surface of the lower support body 21 is away from the substrate 9 and faces the lower surface of the substrate 9.

The plurality of lower holding members 22 each protrude upward from the lower support body 21 and come into contact with an outer edge portion of the substrate 9, to thereby hold the substrate 9. The lower holding member 22 is a so-called "support pin". The lower holding member 22 has a pin-like shape with an upper portion thinner than a lower portion, and when the lower holding member 22 is rotated around a central axis oriented in an up-and-down direction, an upper portion deviated from the central axis is moved to come into contact with the outer edge portion of the substrate 9. The lower holding members 22 mechanically support the substrate 9.

Figure 2:
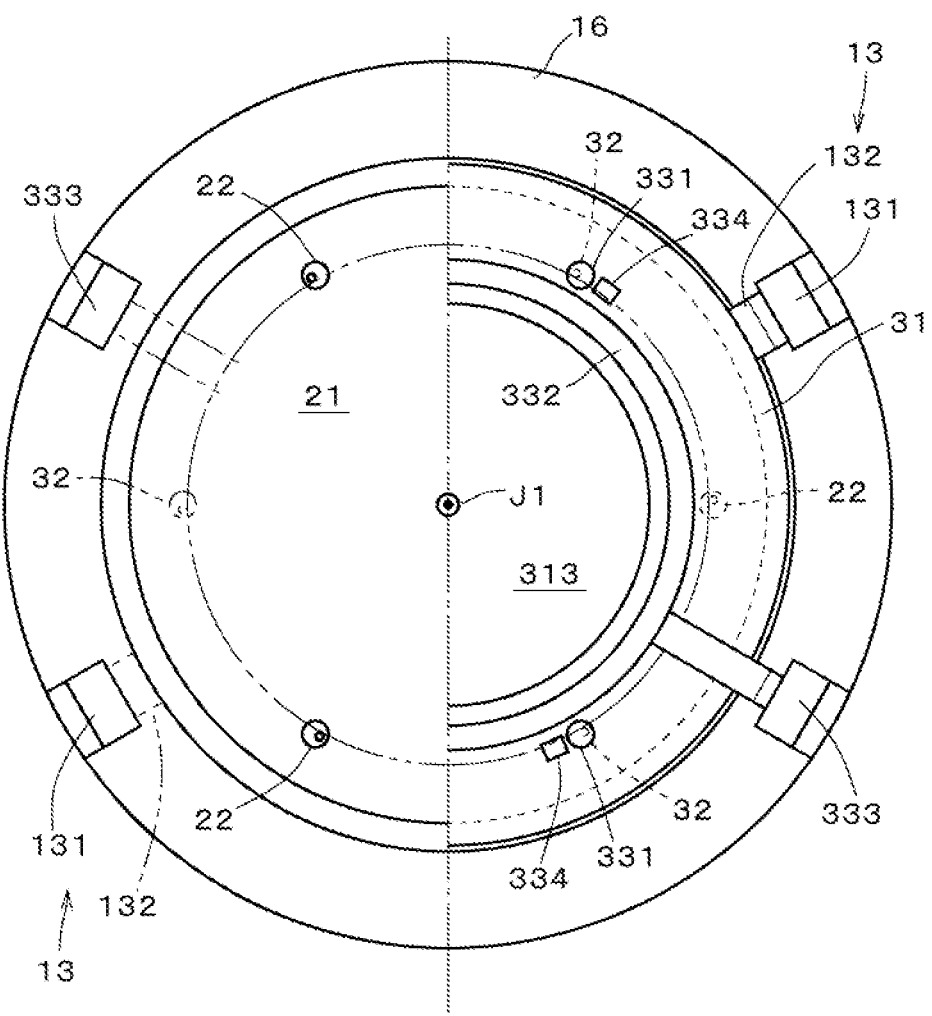
FIG. 2 is a plan view showing part of the substrate processing apparatus.

FIG. 2 is a plan view showing the annular cover 16 and part of its inner structure in the substrate processing apparatus 1. The left side of FIG. 2 shows an upper surface of the lower support body 21, and the right side shows a state where an upper support body 31 described later is placed on the lower support body 21. In the present preferred embodiment, as shown in FIG. 2, the lower support body 21 is provided with three lower holding members 22. The three lower holding members 22 are arranged at regular intervals in a circumferential direction centering on the central axis J1 around which the substrate 9 is rotated. As shown in FIG. 1, each of the lower holding members 22 penetrates the lower support body 21 in the up-and-down direction and is supported rotatably by the lower support body 21 through a not-shown bearing. In the following description, the circumferential direction around the central axis J1 is also referred to simply as a "circumferential direction", a radial direction around the central axis J1 is also referred to simply as a "radial direction", and a direction in parallel with the central axis J1 is also referred to simply as an "axial direction".

As shown in FIG. 1, the lower hold-driving part 23 (see the left side of FIG. 1) includes holding-side magnetic members 231, a driving-side magnetic member 232, a magnetic member moving part 233 (see the right side of FIG. 1), and position restoration parts which are not shown. The holding-side magnetic members 231 are mechanically connected to lower ends of the lower holding members 22, respectively. In the present preferred embodiment, each holding-side magnetic member 231 is a magnet. The driving-side magnetic member 232 has an annular shape around the central axis J1. In the present preferred embodiment, the driving-side magnetic member 232 is a magnet. The magnetic member moving part 233 moves the driving-side magnetic member 232 up and down. In an actual case, the two magnetic member moving parts 233 are provided, being opposed to each other with the central axis J1 as the center (see a magnetic member moving parts 333 in FIG. 2 described later). Three or more magnetic member moving parts 233 may be arranged in the circumferential direction. The number of magnetic member moving parts 233 may be one. As the magnetic member moving part 233, various mechanisms can be used, and the magnetic member moving part 233 may be a cylinder, a combination of a rotary motor and a ball screw, a linear motor, or the like. In the present preferred embodiment, each position restoration part is a magnet fixed on a lower surface of the lower support body 21. The position restoration parts are located close to the holding-side magnetic members 231, respectively. Further, FIG. 2 shows position restoration parts 334 of the upper hold-driving part 33 described later. The position restoration parts of the lower hold-driving part 23 are provided pursuant to the position restoration parts 334 of the upper hold-driving part 33.

In a state where the driving-side magnetic member 232 is moved down by the magnetic member moving part 233, each lower holding member 22 is positioned at a position of holding the substrate 9, by a magnetic action between the holding-side magnetic member 231 and the position restoration part. Specifically, the upper portions of the lower holding members 22 come into contact with the outer edge portion of the substrate 9. The magnetic action may be an attractive force or a repulsive force, and the same applies to the following description. When the driving-side magnetic member 232 is moved up by the magnetic member moving part 233, the magnetic action between each holding-side magnetic member 231 and the driving-side magnetic member 232 overcomes the magnetic action between the holding-side magnetic member 231 and the position restoration part, and the lower holding member 22 is rotated and positioned at a position of not holding the substrate 9. Specifically, the upper portions of the lower holding members 22 are separated from the outer edge portion of the substrate 9.

When the driving-side magnetic member 232 is moved down by the magnetic member moving part 233 from the above state, each lower holding member 22 returns to the position of holding the substrate 9 by the magnetic action between the holding-side magnetic member 231 and the position restoration part. The lower hold-driving part 23 moves the plurality of lower holding members 22 separably from and contactably with the outer edge portion of the substrate 9. Since the driving-side magnetic member 232 has an annular shape around the central axis J1, holding/non-holding of the substrate 9 by the lower holding members 22 can be performed even during the rotation of the substrate 9. By using the magnets, it is possible to move the lower holding members 22 with a simple structure.

Further, all of the holding-side magnetic members 231, the driving-side magnetic member 232, and the position restoration parts do not need to be magnets, but one of them may be a magnetic material such as iron or the like within a range where the magnetic action can be generated. Specifically, at least one of each holding-side magnetic member 231 and the driving-side magnetic member 232 is a magnet, and at least one of each holding-side magnetic member 231 and each position restoration part is a magnet. Further, the position restoration part may not be a magnetic material and may be, for example, an elastic body such as a spring or the like. In this case, by an elastic force acting between the lower holding member 22 and the position restoration part, the lower holding member 22 is moved from a position of not holding the substrate 9 to another position of holding the substrate 9. Furthermore, if the substrate 9 can be held by using a configuration, for example, where the lower holding members 22 can be moved by a centrifugal force to the position of holding the substrate 9 while the substrate 9 is rotated, or the like configuration, the position restoration parts may be omitted.

The upper support part 3 supports the substrate 9 from above in a horizontal position. In the present preferred embodiment, the upper support part 3 directly supports the substrate 9. The upper support part 3 includes an upper support body 31, a plurality of upper holding members 32, and an upper hold-driving part 33 (see the right side of FIG. 1). FIG. 1 shows one upper holding member 32 on the right side. The upper support body 31 faces an upper surface of the substrate 9. Specifically, the upper support body 31 is away from the substrate 9 and faces the upper surface of the substrate 9. To be exact, the upper support body 31 faces part of the upper surface of the substrate 9, being away therefrom in the up-and-down direction.

In the present preferred embodiment, the upper support body 31 is an annular member around the central axis J1. The upper support body 31 is separably placed on (the lower support body 21 of) the lower support part 2. The upper support body 31 rotates together with the lower support part 2 (however, except a non-rotating portion thereof) while covering the outer edge portion of the substrate 9 supported by the lower support part 2. In the following description, when it comes to the rotation of the lower support part 2, it means that a rotating portion of the lower support part 2, in particular, the lower support body 21 and the lower holding members 22 rotate. Further, the phrase "the substrate 9 supported by the lower support part 2" is a description focusing on the lower support part 2, for convenience, which more correctly refers to "the substrate 9 supported only by the lower support part 2", "the substrate 9 which is indirectly supported by the lower support part 2 through the upper support part 3", or "the substrate 9 supported by the lower support part 2 and the upper support part 3", in consideration of a holding-switch operation described later, and when there is no special description on the support, the same applies to the following.

Figure 3A:
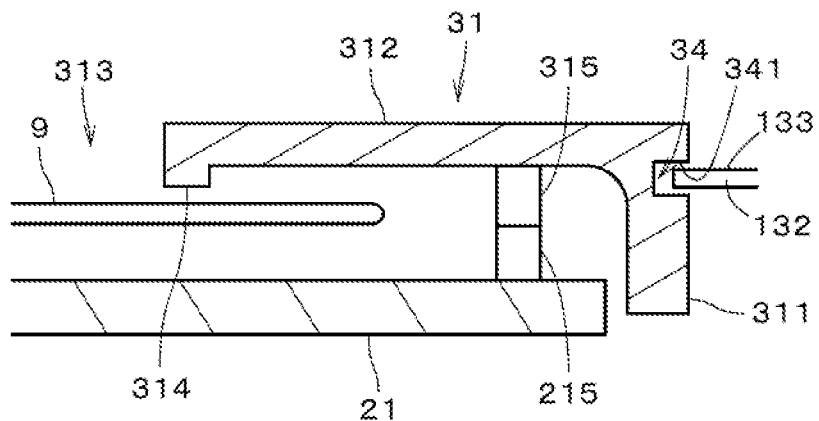
FIG. 3A is a longitudinal section of an upper support body placed on a lower support body.

FIG. 3A shows a longitudinal section (only one side with respect to the central axis J1) of the upper support body 31 placed on the lower support body 21. The upper support body 31 which is an annular member includes an annular sidewall 311 opposed to an outer periphery of the substrate 9 supported by the lower support part 2 and an outer periphery of the lower support part 2 (however, except the lower hold-driving part 23) in the radial direction and an annular upper portion 312 which extends from the annular sidewall 311 inward in the radial direction and is opposed to an outer edge portion of the upper surface of the substrate 9 in the up-and-down direction. The area of an opening 313 (see FIGS. 1 and 2) of the annular upper portion 312 above the substrate 9 is preferably not less than a half of the area of the substrate 9 (to be exact, the area of the substrate 9 in a plan view and the same applies to the following).

The opening 313 is largely opened above the substrate 9, and more preferably, the area of the opening 313 is not less than three-quarters of the area of the substrate 9. Especially, in a case where the substrate processing apparatus 1 processes the outer edge portion of the substrate 9, more preferably in a case where an etching process is performed on the outer edge portion of the substrate 9, it is preferable that a covering range of the annular upper portion 312 above the substrate 9 should be not more than 20 mm from an outer peripheral end (edge) of the substrate 9 inward in the radial direction. More preferably, the above-described range should be not more than 10 mm.

Figure 3B:
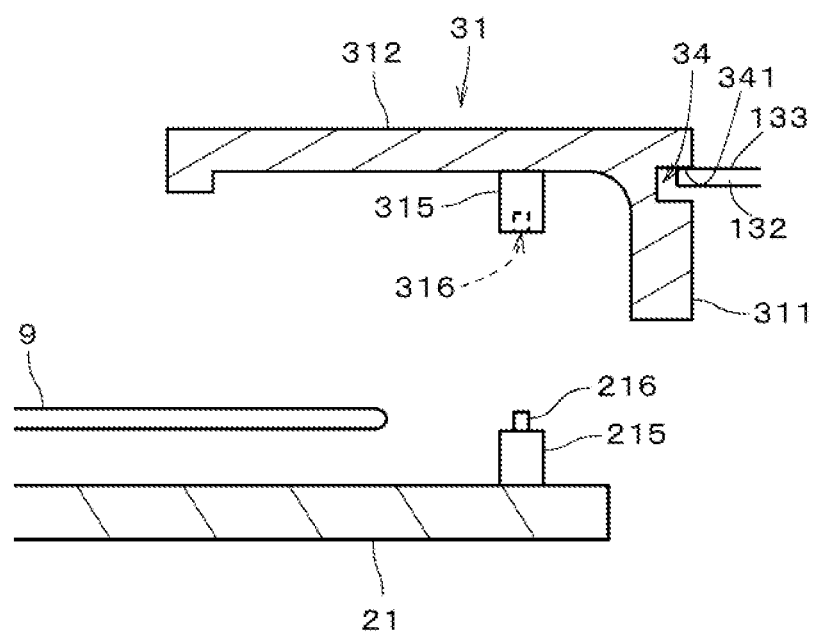
FIG. 3B is a longitudinal section showing a state where the upper support body is lifted from the lower support body.

FIG. 3B is a longitudinal section showing a state where the upper support body 31 is lifted from the lower support body 21 by an up-and-down moving part 13 described later. The upper surface of the lower support body 21 is provided with a plurality of protruding portions 215 protruding upward. The protruding portions 215 are positioned outward in the radial direction relative to the upper holding member 32 (see FIG. 1). The plurality of protruding portions 215 are arranged at regular intervals in the circumferential direction. The number of protruding portions 215 is, for example, 3 or 6, and preferably each protruding portion 215 is positioned between the upper holding member 32 and the lower holding member 22 in the circumferential direction. The number of protruding portions 215 is not limited to 3 or 6, has only to be not less than 2, and preferably not less than 3. At an upper end of the protruding portion 215, provided is a pin-like small projection 216. In FIG. 2, the protruding portion 215 is not shown.

On the other hand, as shown in FIG. 3B, a plurality of protruding portions 315 protruding downward are provided on a lower surface of the annular upper portion 312 of the upper support body 31. The protruding portions 315 are provided at the positions corresponding to the protruding portions 215 of the lower support body 21. The number of protruding portions 315 is the same as that of the protruding portions 215. At a lower end of the protruding portion 315, provided is a small recessed portion 316 recessed upward. When the upper support body 31 is placed on the lower support body 21, the respective positions of the protruding portions 215 and the protruding portions 315 are aligned, and the upper support body 31 is moved down, to thereby insert the small projections 216 into the small recessed portions 316, and the protruding portions 215 and the protruding portion 315s come into contact with each other, as shown in FIG. 3A. The position of the upper support body 31 relative to the lower support body 21 is thereby fixed in the circumferential direction and the radial direction. When the lower support body 21 (and the lower holding members 22) is rotated around the central axis J1 by the rotating part 12, the upper support body 31 (and the upper holding members 32) is also rotated around the central axis J1. In other words, when the lower support part 2 is rotated around the central axis J1, the upper support part 3 (however, except the non-rotating portion thereof) is also rotated around the central axis J1. In the following description, like in the case of the lower support part 2, when it comes to the rotation of the upper support part 3, it means that a rotating portion of the upper support part 3, in particular, the upper support body 31 and the upper holding members 32 rotate.

As to a preferable position of an engagement part (the protruding portions 215 and 315) for engaging the upper support body 31 and the lower support body 21 with each other, it is generally expressed that the engagement part is positioned outside the position of holding the substrate 9 in the radial direction and positioned between a plurality of positions of holding the substrate 9 in the circumferential direction.

When the upper support body 31 is placed on the lower support body 21, a configuration where the position of the upper support body 31 relative to the lower support body 21 is fixed in the circumferential direction and the radial direction may be variously modified. There may be a configuration, for example, where the protruding portion 215 is provided with a small recessed portion and the protruding portion 315 is provided with a small projection. There may be another configuration where either the lower support body 21 or the upper support body 31 is provided with protruding portions. There may be still another configuration where a structure in which a relative position of the upper support body 31 relative to the lower support body 21 is fixed only in the circumferential direction and a structure in which a relative position of the upper support body 31 relative to the lower support body 21 is fixed only in the radial direction are individually provided between the lower support body 21 and the upper support body 31. There may be yet another configuration where a structure is provided in which the position of the upper support body 31 relative to the lower support body 21 is fixed both in the circumferential direction and in the radial direction between the lower support body 21 and the annular sidewall 311 of the upper support body 31.

As shown in FIG. 3A, in a state where the upper support body 31 is placed on the lower support body 21, the annular sidewall 311 is away from the lower support body 21 outward in the radial direction. A lower end of the annular sidewall 311 is positioned below the upper surface of the lower support body 21. The lower end of the annular sidewall 311 may be positioned below the lower surface of the lower support body 21. The lower surface of the annular upper portion 312 and an inner peripheral surface of the annular sidewall 311 are preferably smoothly connected to each other. Specifically, the lower surface of the annular upper portion 312 and the inner peripheral surface of the annular sidewall 311 are connected to each other through a substantially arc or substantially elliptical arc portion in the longitudinal section. Even when a liquid is deposited on the lower surface of the annular upper portion 312, the liquid is smoothly guided to the inner peripheral surface of the annular sidewall 311 and drained down.

An upper end of the inner peripheral surface of the annular sidewall 311 may be determined as appropriate, but when the lower surface of the annular upper portion 312 and the inner peripheral surface of the annular sidewall 311 are connected to each other with a smooth surface or a sloped surface (hereinafter, these surfaces will be referred to as a "connection surface"), the connection surface may be regarded as part of the inner peripheral surface of the annular sidewall 311. Specifically, the upper end of the inner peripheral surface of the annular sidewall 311 may be understood as a boundary between the lower surface of the annular upper portion 312 and the connection surface. From this point, even when the connection surface is positioned in the horizontal direction from the upper surface and the lower surface of the substrate 9, the annular sidewall 311 is positioned radially outward of the substrate 9 and the annular sidewall 311 receives droplets spattered from the substrate 9. In such understanding, the upper end of the inner peripheral surface of the annular sidewall 311 is positioned above the upper surface of the substrate 9.

As shown in FIG. 3A, an inner peripheral portion of the lower surface of the annular upper portion 312 is provided with an annular protruding portion 314 protruding downward. The annular protruding portion 314 has an annular shape around the central axis J1. The annular protruding portion 314 may be provided at an inner peripheral end of the annular upper portion 312, or may be provided slightly outward in the radial direction from the inner peripheral end. The width of the annular protruding portion 314 in the radial direction and the height of the annular upper portion 312 from the lower surface thereof downward are set as appropriate in accordance with an airflow to be generated at the outer edge portion of the substrate 9 during the processing as described later. Due to the presence of the annular protruding portion 314, the speed of the airflow between the upper surface of the substrate 9 and the upper support body 31 is increased as compared with a case where no annular protruding portion 314 is present. Further, the annular protruding portion 314 serves to generate a desirable airflow at the outer edge portion of the substrate 9 as well as the annular upper portion 312, and if a desirable airflow can be generated at the outer edge portion of the substrate 9 in the annular upper portion 312 without the annular protruding portion 314, the annular protruding portion 314 may be omitted.

The "outer edge portion" of the substrate 9 refers to a range having a certain width, from an outer peripheral end of the substrate 9 toward a center side of the substrate 9. This width may be very small or may be large to some degree. For example, the "outer edge portion" may be only an arc area at the outer peripheral end of the substrate 9 in the longitudinal section or an area extending inward by several cm toward the center of the substrate 9 in addition to the arc area. As described later, a range where an etching solution goes around from the lower surface to the upper surface of the substrate 9 (e.g., a range of 0.5 to 3 mm) may be regarded as the outer edge portion or a range where the substrate 9 and the annular upper portion 312 overlap each other in the up-and-down direction may be regarded as the outer edge portion. Alternatively, on the substrate 9, an area outside the annular protruding portion 314 in the radial direction may be regarded as the outer edge portion. As a matter of course, the term "outer edge portion" is appropriately understood in accordance with a context where the term is used.

As shown in FIG. 1, the plurality of upper holding members 32 protrude downward from the upper support body 31 and come into contact with the outer edge portion of the substrate 9, to thereby hold the substrate 9. The upper holding member 32 is a so-called "support pin". The upper holding member 32 has a pin-like shape with a lower portion thinner than an upper portion, and when the upper holding member 32 is rotated around the central axis oriented in the up-and-down direction, a lower portion deviated from the central axis is moved to come into contact with the outer edge portion of the substrate 9. The upper holding members 32 mechanically support the substrate 9. Further, a recessed portion is provided, in accordance with the outer edge portion of the substrate 9, in a portion of a lower-portion side surface of the upper holding member 32, which comes into contact with the substrate 9, so that only the upper holding members 32 can hold the substrate 9 while preventing the substrate 9 from falling.

In the present preferred embodiment, as shown in FIG. 2, the upper support body 31 is provided with three upper holding members 32. The three upper holding members 32 are arranged at regular intervals in the circumferential direction centering on the central axis J1 around which the substrate 9 is rotated. Each upper holding member 32 is arranged between the lower holding members 22, and in the exemplary case of FIG. 2, the upper holding members 32 and the lower holding members 22 are arranged alternately at intervals of 60 degrees. The number of upper holding members 32 and the number of lower holding members 22 are each not limited to three, but may be four or more. The number of upper holding members 32 and the number of lower holding members 22 may be different from each other. As shown in FIG. 1, each of the upper holding members 32 penetrates the upper support body 31 in the up-and-down direction and is supported rotatably by the upper support body 31 through a not-shown bearing.

The upper hold-driving part 33 has a configuration pursuant to the lower hold-driving part 23. The upper hold-driving part 33 (see the right side of FIG. 1) includes holding-side magnetic members 331, a driving-side magnetic member 232, a magnetic member moving part 233 (see the left side of FIG. 1), and position restoration parts 334 (see FIG. 2). As shown in FIG. 1, the holding-side magnetic members 331 are mechanically connected to upper ends of the upper holding members 32, respectively. In the present preferred embodiment, each holding-side magnetic member 331 is a magnet. The driving-side magnetic member 332 has an annular shape around the central axis J1 (see FIG. 2). In the present preferred embodiment, the driving-side magnetic member 332 is a magnet. The magnetic member moving part 333 moves the driving-side magnetic member 332 up and down. As shown in FIG. 2, the two magnetic member moving parts 333 are provided, being opposed to each other with the central axis J1 as the center. Three or more magnetic member moving parts 333 may be arranged in the circumferential direction. The number of magnetic member moving parts 333 may be one. As the magnetic member moving part 333, various mechanisms can be used, and the magnetic member moving part 333 may be a cylinder, a combination of a rotary motor and a ball screw, a linear motor, or the like. In the present preferred embodiment, each position restoration part 334 is a magnet fixed on an upper surface of the upper support body 31. The position restoration parts 334 are located close to the holding-side magnetic members 331, respectively.

In a state where the driving-side magnetic member 332 is moved up by the magnetic member moving part 333, each upper holding member 32 is positioned at a position of holding the substrate 9, by a magnetic action between the holding-side magnetic member 331 and the position restoration part 334. Specifically, the lower portions of the upper holding members 32 come into contact with the outer edge portion of the substrate 9. When the driving-side magnetic member 332 is moved down by the magnetic member moving part 333, the magnetic action between each holding-side magnetic member 331 and the driving-side magnetic member 332 overcomes the magnetic action between the holding-side magnetic member 331 and the position restoration part 334, and the upper holding member 32 is rotated and positioned at a position of not holding the substrate 9. Specifically, the lower portions of the upper holding members 32 are separated from the outer edge portion of the substrate 9.

When the driving-side magnetic member 332 is moved up by the magnetic member moving part 333 from the above state, each upper holding member 32 returns to the position of holding the substrate 9 by the magnetic action between the holding-side magnetic member 331 and the position restoration part 334. Thus, the upper hold-driving part 33 moves the plurality of upper holding members 32 separably from and contactably with the outer edge portion of the substrate 9. Since the driving-side magnetic member 332 has an annular shape around the central axis J1, holding/non-holding of the substrate 9 by the upper holding members 32 can be performed even during the rotation of the substrate 9. By using the magnets, it is possible to move the upper holding members 32 with a simple structure.

Further, all of the holding-side magnetic members 331, the driving-side magnetic member 332, and the position restoration parts 334 do not need to be magnets, but one of them may be a magnetic material such as iron or the like within a range where the magnetic action can be generated. Specifically, at least one of each holding-side magnetic member 331 and the driving-side magnetic member 332 is a magnet, and at least one of each holding-side magnetic member 331 and each position restoration part 334 is a magnet. Further, the position restoration part 334 may not be a magnetic material and may be, for example, an elastic body such as a spring or the like. In this case, by an elastic force acting between the upper holding member 32 and the position restoration part 334, the upper holding member 32 is moved from a position of not holding the substrate 9 to another position of holding the substrate 9. Furthermore, if the substrate 9 can be held by using a configuration, for example, where the upper holding members 32 can be moved by a centrifugal force to the positions of holding the substrate 9 while the substrate 9 is rotated, or the like configuration, the position restoration parts 334 may be omitted.

As shown in FIG. 1, a rotation axis of the rotating part 12 is connected to the lower support body 21. The rotating part 12 rotates the lower support part 2 around the central axis J1. The rotation axis is hollow and an upper end thereof serves as a lower nozzle 41 described later.

The up-and-down moving part 13 moves the upper support body 31 up and down relative to the lower support body 21. The upper support body 31 is a placement member placed on the lower support body 21. In other words, the up-and-down moving part 13 moves the upper support body 31 which is a placement member up and down relative to the lower support part 2. The up-and-down moving part 13 includes an up-and-down-move driving part 131 and a tip portion 132 to be moved up and down by the up-and-down-move driving part 131. As the up-and-down-move driving part 131, various mechanisms can be used, and the up-and-down-move driving part 131 may be a cylinder, a combination of a rotary motor and a ball screw, a linear motor, or the like. In an actual case, as shown in FIG. 2, two up-and-down moving parts 13 are provided at such positions as to be opposed to each other with the central axis J1 as the center. Three or more up-and-down moving parts 13 may be arranged in the circumferential direction.

In an outer peripheral surface of the upper support body 31, a groove 34 recessed inward in the radial direction is provided along the entire circumference. The tip portion 132 of the up-and-down moving part 13 extends toward the groove 34 of the upper support body 31 from the outside in the radial direction. As shown in FIG. 3B, when the tip portion 132 is moved up, an upper-side surface 341 of the groove 34, facing downward, comes into contact with an upper surface 133 of the tip portion 132 and the upper support body 31 is thereby separated upward from the lower support body 21. Hereinafter, the groove 34 is referred to as a "first contact part", the tip portion 132 is referred to as a "second contact part", the surface 341 is referred to as a "first contact surface", and the upper surface 133 is referred to as a "second contact surface".

When the second contact part 132 is moved down by the up-and-down-move driving part 131, as shown in FIG. 3A, the upper support body 31 is placed on the lower support body 21 and the second contact surface 133 is separated from the first contact surface 341. In other words, the second contact part 132 is separated from the first contact part 34. Since the first contact part 34 is formed along the entire circumference, the lower support part 2 can be rotated in the state where the first contact part 34 and second contact part 132 are separated from each other. Since the first contact surface 341 is an annular surface with the central axis J1 as its center, even if a rotation position of the upper support body 31 is any position, the upper support body 31 can be moved up and down by the up-and-down moving part 13.

The up-and-down moving part 13 supports an outer peripheral portion of the upper support body 31 and moves the upper support body 31 up and down. Therefore, in the substrate processing apparatus 1, there is no mechanism provided immediately above the upper support body 31, for moving the upper support body 31 up and down. As a result, it is possible to suppress the height of the substrate processing apparatus 1 to be lower. In order to achieve such a configuration, it is preferable that in the state where the upper support body 31 is placed on the lower support part 2, the position of the first contact part 34 in a height direction should be not higher than 150 mm from the upper surface of the lower support body 21. It is thereby possible to suppress the height of the portion relating to the processing to be lower while keeping a processing space. Further, it is possible to also effectively use a space above the upper support body 31. More preferably, the position of the first contact part 34 in the height direction should be not more than 100 mm from the upper surface of the upper support body 31. Further preferably, the height of the upper support body 31 should be not higher than 150 mm.

As shown in FIG. 1, the annular liquid receiving part 15 is provided below a gap between the lower support body 21 and the annular sidewall 311 of the upper support body 31. The liquid receiving part 15 has an annular shape around the central axis J1. The liquid receiving part 15 receives a liquid dropping from the gap between the lower support body 21 and the annular sidewall 311.

The annular cover 16 is disposed in a still state outside the upper support body 31, which is an annular member, in the radial direction. The annular cover 16 has an annular shape around the central axis J1. An upper portion of the annular cover 16 gets closer to the outer peripheral surface of the annular sidewall 311 of the upper support body 31 while going inward in the radial direction. An inner peripheral end of the annular cover 16 is separated from the outer peripheral surface of the annular sidewall 311. The up-and-down-move driving part 131 of the up-and-down moving part 13 is provided above the annular cover 16. It is thereby possible to suppress the size (so-called footprint) of the substrate processing apparatus 1 in a horizontal plane to be smaller. In the substrate processing apparatus 1, the magnetic member moving part(s) 333 of the upper hold-driving part 33 is also provided above the annular cover 16 (see FIG. 2). It is also thereby possible to suppress the size of the substrate processing apparatus 1 in the horizontal plane to be smaller.

Further, in the present preferred embodiment, since the upper support body 31 directly receives the droplets spattered from the substrate 9, the annular cover 16 is provided, serving to subsidiarity prevent the spatter of the droplets. For this reason, it is possible to reduce the width of the annular cover 16 in the radial direction as compared with the case where the annular cover 16 directly receives the droplets, and the mechanism for moving the annular cover 16 up and down becomes not needed and the apparatus structure can be simplified. Since the upper support body 31 rotates together with the substrate 9, the amount of splashed droplets generated at the time when the droplets spattered from the substrate 9 clash against the annular sidewall 311 is suppressed as compared with the case where the annular sidewall 311 is not provided. With fixed arrangement of the annular cover 16, it becomes easier to arrange the up-and-down-move driving part(s) 131 and the magnetic member moving part(s) 333 above the annular cover 16. Below the annular cover 16, provided is an exhaust part for exhausting gas to the outside of the substrate processing apparatus 1.

As shown in FIG. 1, the processing liquid supply part 4 includes a lower nozzle 41, an upper nozzle 42, a not-shown nozzle moving part, and a not-shown processing liquid supply source. As described earlier, the lower nozzle 41 is provided at the upper end of the rotation axis of the rotating part 12. A processing liquid ejected from the lower nozzle 41 is supplied onto the lower surface of the substrate 9 supported by the lower support part 2. The upper nozzle 42 is moved by the nozzle moving part between a position above the substrate 9 and another position deviated from above the substrate 9. A processing liquid ejected from the upper nozzle 42 is supplied onto the upper surface of the substrate 9 supported by the lower support part 2. The processing liquid supply source individually supplies the processing liquids to the lower nozzle 41 and the upper nozzle 42 from tanks storing therein the processing liquids by using pumps or the like. In the present preferred embodiment, the processing liquid supplied to the lower nozzle 41 is a rinse liquid which is deionized water, an etching solution, or the like. The processing liquid supplied to the upper nozzle 42 is a rinse liquid which is deionized water or the like. As the rinse liquid, carbonated water, hydrogen water, ozone water, SC1, SC2, or the like may be used. The etching solution is, for example, an aqueous solution such as hydrofluoric acid, nitric acid, hydrochloric acid, sulfuric acid, oxygenated water, or the like, a mixed solution of two or more selected out of these aqueous solutions, or a solution containing any of these aqueous solutions or the mixed solution.

The processing liquid is not limited to the rinse liquid or the etching solution. Further, in the present preferred embodiment, the upper nozzle 42 may be omitted. Depending on the kind of processing, there may be a configuration where the lower nozzle 41 is omitted and only the upper nozzle 42 is provided in the substrate processing apparatus 1. When the upper support body 31 is moved up and the substrate 9 is loaded or unloaded, the upper nozzle 42 is retracted by the nozzle moving part to a position where the upper nozzle 42 does not interfere with the upper support body 31.

Figure 4:
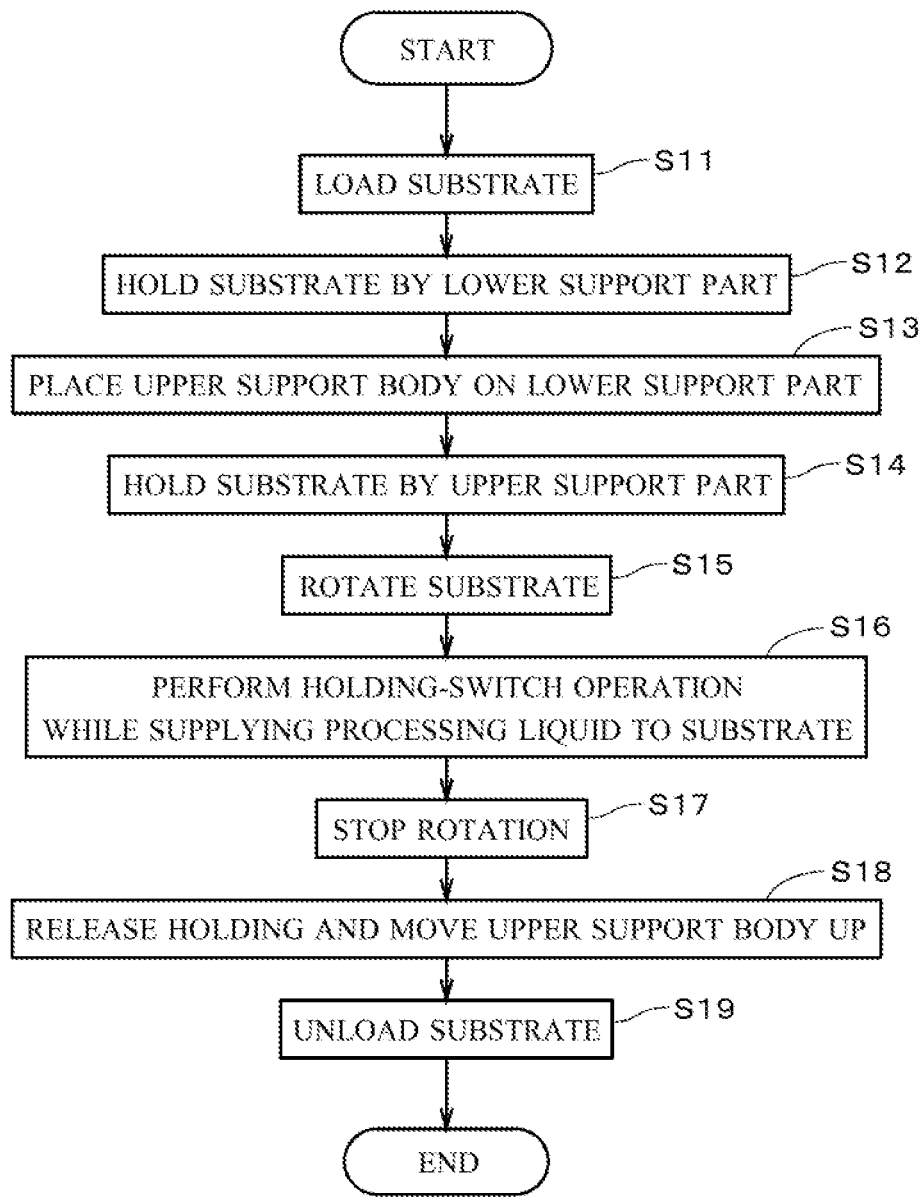
FIG. 4 is a flowchart showing an exemplary operation flow of the substrate processing apparatus.

FIG. 4 is a flowchart showing an exemplary operation flow of the substrate processing apparatus 1. FIGS. 5A to 5D are views each showing a state of the substrate processing apparatus 1. The substrate processing apparatus 1 operates in accordance with the control of the control part which is not shown.

Figure 5A:
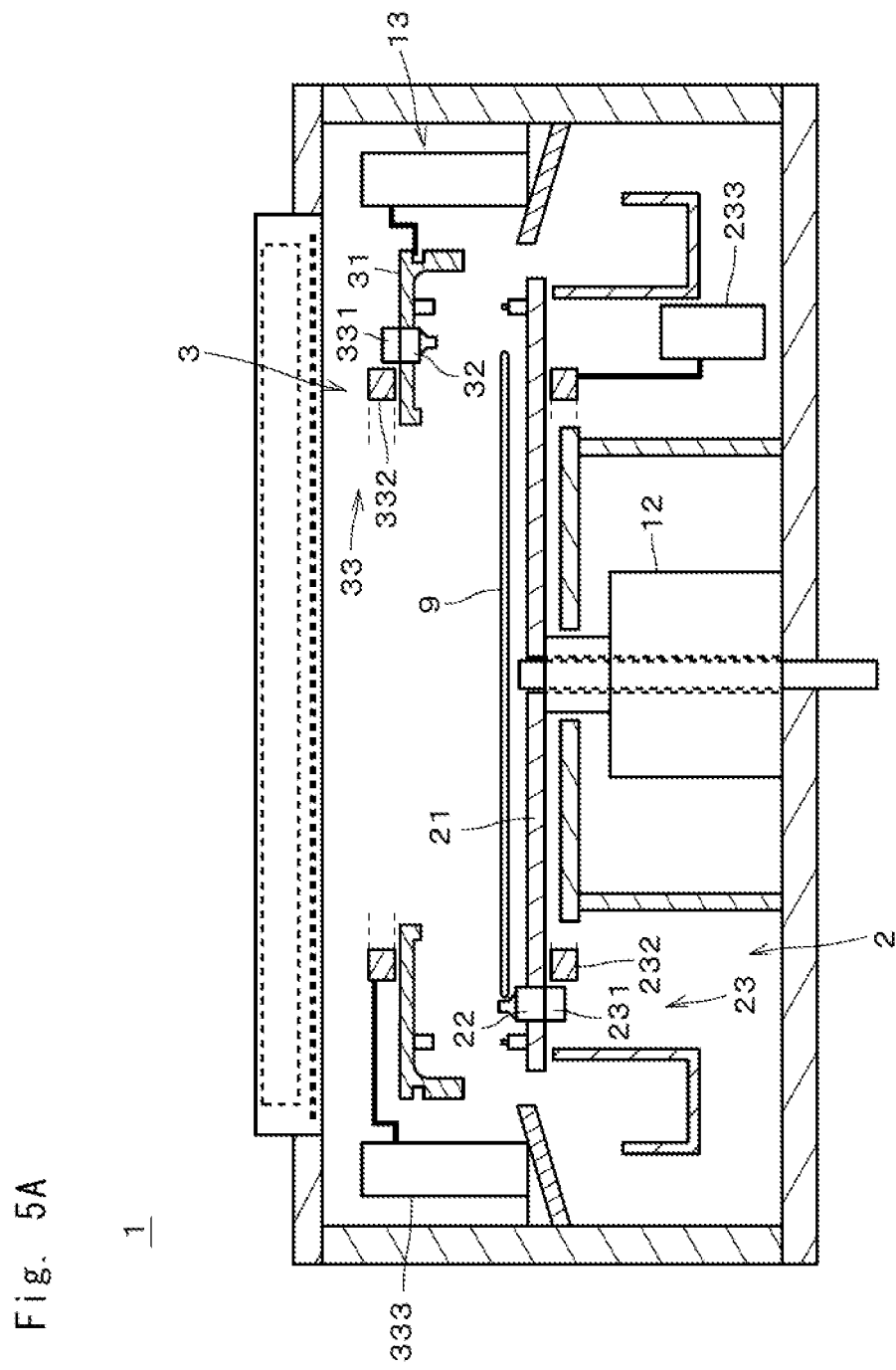
FIG. 5A is a view showing a state of the substrate processing apparatus.

First, as shown in FIG. 5A, in a state where the upper support body 31 is moved up and a state where the driving-side magnetic member 332 of the upper hold-driving part 33 gets closer to the holding-side magnetic members 331 and the driving-side magnetic member 232 of the lower hold-driving part 23 gets closer to the holding-side magnetic members 231, the substrate 9 is loaded by an external transfer mechanism (Step S11). After that, when the magnetic member moving part 233 of the lower hold-driving part 23 moves the driving-side magnetic member 232 down, the substrate 9 is held by the lower holding members 22 (Step S12).

By the magnetic member moving part 333 of the upper hold-driving part 33 and the up-and-down moving part 13, the upper support body 31 is moved down while the state where the driving-side magnetic member 332 of the upper hold-driving part 33 gets closer to the holding-side magnetic members 331 is kept. The upper support body 31 is thereby placed on the lower support body 21 (Step S13). After that, when the magnetic member moving part 333 moves the driving-side magnetic member 332 up, as shown in FIG. 5B, the substrate 9 is held by the upper holding members 32 (Step S14). In other words, the substrate 9 is held by the upper support part 3 and the lower support part 2.

The rotating part 12 rotates the lower support part 2. The substrate 9 is thereby rotated (Step S15). The upper nozzle 42 is moved to above the upper support body 31 from the position where the upper nozzle 42 is retracted to the side of the upper support body 31. During the rotation of the substrate 9, first, the rinse liquid is supplied onto the lower surface and the upper surface of the substrate 9 from the lower nozzle 41 and the upper nozzle 42, respectively. The supplied rinse liquid flows outward in the radial direction on the lower surface and the upper surface of the substrate 9, and is spattered from the outer peripheral end of the substrate 9 and received by the annular sidewall 311 of the upper support body 31. The liquid drops downward from the annular sidewall 311 and is received by the liquid receiving part 15. After that, the supply of the rinse liquid is stopped.

Next, the etching solution is supplied onto the lower surface of the substrate 9 from the lower nozzle 41. The supplied etching solution flows outward in the radial direction on the lower surface of the substrate 9, and is spattered from the outer peripheral end of the substrate 9 and received by the annular sidewall 311. The liquid drops downward from the annular sidewall 311 and is received by the liquid receiving part 15.

Figure 6:
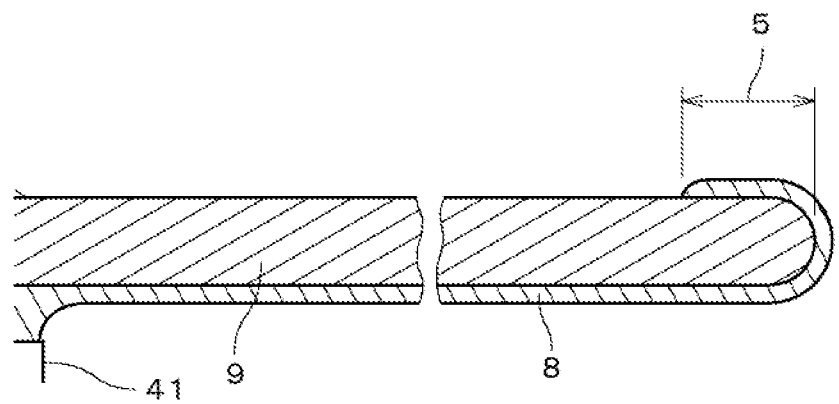
FIG. 6 is a view showing a state of an etching solution.

FIG. 6 is a view showing a state of the etching solution 8. The etching solution 8 flowing on the lower surface of the substrate 9 slightly goes around to the upper surface side at the outer peripheral end of the substrate 9. Hereinafter, the distance 5 in the radial direction from the outer peripheral end to the upper surface of the substrate 9, in which the etching solution 8 goes around, is referred to as "the amount of go-around". Various factors affect the amount of go-around 5, and one of the factors is the speed of an airflow flowing outward in the radial direction on the upper surface of the substrate 9. In order to make the airflow speed desirable, a sectional shape of the annular upper portion 312 of the upper support body 31 is designed. Specifically, with reference to FIG. 3A, the longitudinal section shape of the upper support body 31 is designed while the width where the annular upper portion 312 overlaps the outer edge portion of the substrate 9 in the up-and-down direction, the distance between the upper surface of the substrate 9 and the annular upper portion 312, the width of the annular protruding portion 314 in the radial direction, the height of the annular protruding portion 314 downward from the lower surface of the annular upper portion 312, the position of the annular protruding portion 314 in the radial direction, and the like are adjusted. Particularly, with the annular protruding portion 314, it is possible to easily make the airflow speed on the outer edge portion of the substrate 9 desirable and make the amount of go-around 5 appropriate distance.

In addition, in the case of the present preferred embodiment, since an airflow from the airflow generation part 111 is directly guided onto the upper surface of the substrate 9 through the opening 313 of the upper support body 31, it is possible to easily make the airflow speed on the outer edge portion of the substrate 9 desirable. Direct guiding of the airflow from the airflow generation part 111 onto the upper surface of the substrate 9 is achieved by a configuration where at least part of the airflow generation part 111 is directly opposed to at least part of the upper surface of the substrate 9 in the up-and-down direction (without any object therebetween).

In a case where the diameter and the thickness of the substrate 9 are 300 mm and 775 μm, respectively, an example of the amount of go-around 5 to be obtained is 2 mm to 3 mm.

Figure 5D:
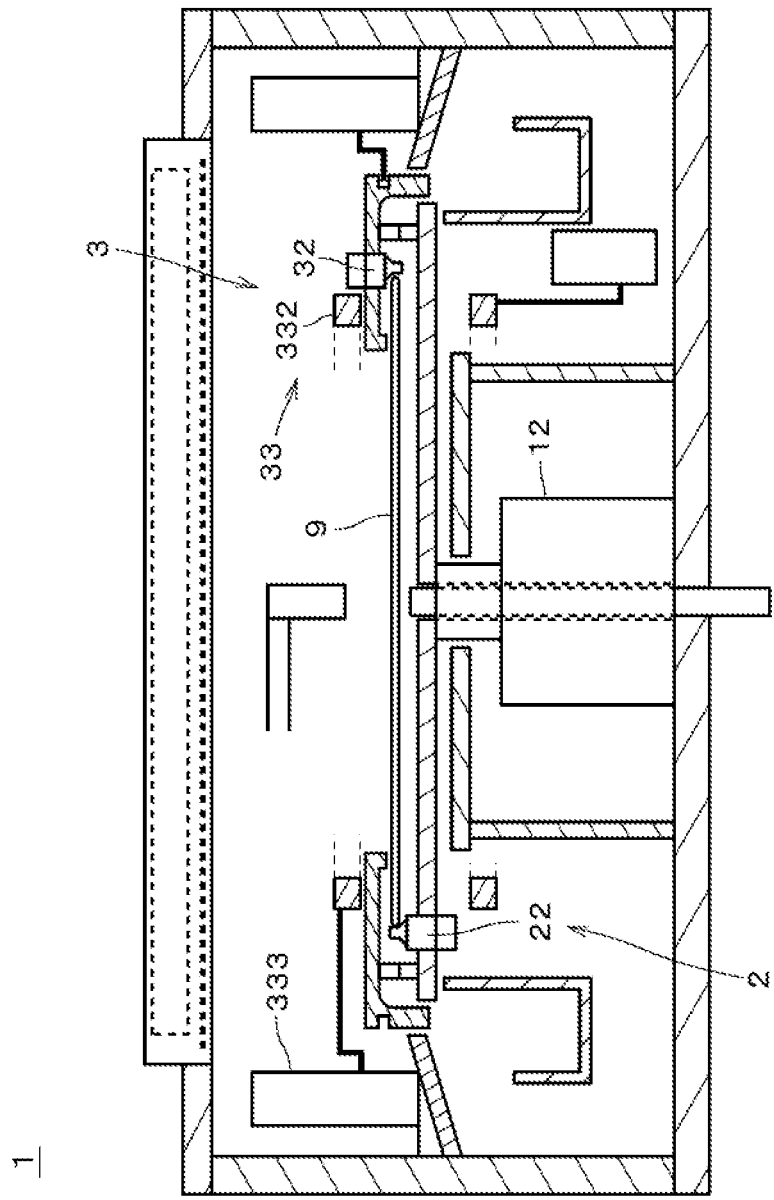
FIG. 5D is a view showing yet another state of the substrate processing apparatus.

While the etching solution is supplied onto the substrate 9, in the substrate processing apparatus 1, a holding-switch operation of the substrate 9 is performed. Specifically, as shown in FIG. 5C, the magnetic member moving part 233 of the lower hold-driving part 23 moves the driving-side magnetic member 232 up, and holding of the substrate 9 by the lower holding members 22 is released and this causes a state where the substrate 9 is held only by the upper holding members 32. After that, the magnetic member moving part 233 moves the driving-side magnetic member 232 down, and the state is thereby returned, where the lower holding members 22 and the upper holding members 32 hold the substrate 9. Next, as shown in FIG. 5D, the magnetic member moving part 333 of the upper hold-driving part 33 moves the driving-side magnetic member 332 down, and holding of the substrate 9 by the upper holding members 32 is released and this causes a state where the substrate 9 is held only by the lower holding members 22. After that, the magnetic member moving part 333 moves the driving-side magnetic member 332 up, and the state is thereby returned, where the lower holding members 22 and the upper holding members 32 hold the substrate 9. By repeating the above-described processes, the holding-switch operation of the substrate 9 is performed. After that, the supply of the etching solution onto the substrate 9 is stopped.

In general, the amount of go-around is increased in the vicinity of the position where the substrate 9 and the holding members are in contact with each other. By performing the holding-switch operation of the substrate 9, the increase in the amount of go-around is reduced.

Further, it is not necessary that the time for holding the substrate 9 only by the upper holding members 32 should be equal to the time for holding the substrate 9 only by the lower holding members 22. Furthermore, it is not necessary that the state where the substrate 9 is held only by the upper holding members 32 and the state where the substrate 9 is held only by the lower holding members 22 should be achieved alternately. While the substrate 9 is processed, the state where the substrate 9 is held by the plurality of upper holding members 32 and not held by the plurality of lower holding members 22 and the state where the substrate 9 is held by the plurality of lower holding members 22 and not held by the plurality of upper holding members 32 have only to be achieved. It is thereby possible to perform the processing using the processing liquid at holding positions.

From the lower nozzle 41 and the upper nozzle 42 of the processing liquid supply part 4, the rinse liquid is supplied again to the lower surface and the upper surface of the substrate 9, respectively. The supplied rinse liquid flows outward in the radial direction on the lower surface and the upper surface of the substrate 9, and is spattered from the outer peripheral end of the substrate 9 and received by the annular sidewall 311 of the upper support body 31. The liquid drops downward from the annular sidewall 311 and is received by the liquid receiving part 15. After that, the supply of the rinse liquid is stopped. With the above-described process, the processing using the processing liquid on the substrate 9 is completed (Step S16). Also while the rinse liquid is supplied onto the substrate 9, the holding-switch operation of the substrate 9 may be performed. Also when the rinse liquid is supplied onto the substrate 9 before the etching solution is supplied onto the substrate 9, the holding-switch operation of the substrate 9 may be performed.

In the substrate processing apparatus 1, the substrate 9 is held by the three lower holding members 22 and the three upper holding members 32. When the processing liquid is supplied onto the lower surface of the substrate 9, part of the processing liquid flowing outward in the radial direction clashes against the lower holding members 22. If the upper holding members 32 are omitted and six lower holding members 22 are provided, the amount of processing liquid clashing against the lower holding members 22 increases. As a result, the generated mist and droplets of the processing liquid also increase. In the substrate processing apparatus 1, by providing the upper holding members 32, it is possible to reduce the mist and droplets of the processing liquid to be generated and improve the quality of the processing.

The rotation of the substrate 9 is stopped (Step S17), the driving-side magnetic member 232 of the lower hold-driving part 23 is moved up, and holding of the substrate 9 by the lower holding members 22 is released. Further, the driving-side magnetic member 332 of the upper hold-driving part 33 is moved down and holding of the substrate 9 by the upper holding members 32 is also released. The upper nozzle 42 is retracted to the side, and as shown in FIG. 5A, the upper support body 31 and the driving-side magnetic member 332 are moved up by the up-and-down moving part 13 and the magnetic member moving part 333 (Step S18). Then, the substrate 9 is unloaded by the external transfer mechanism (Step S19).

In the substrate processing apparatus 1, various modifications can be made.

Figure 7A:
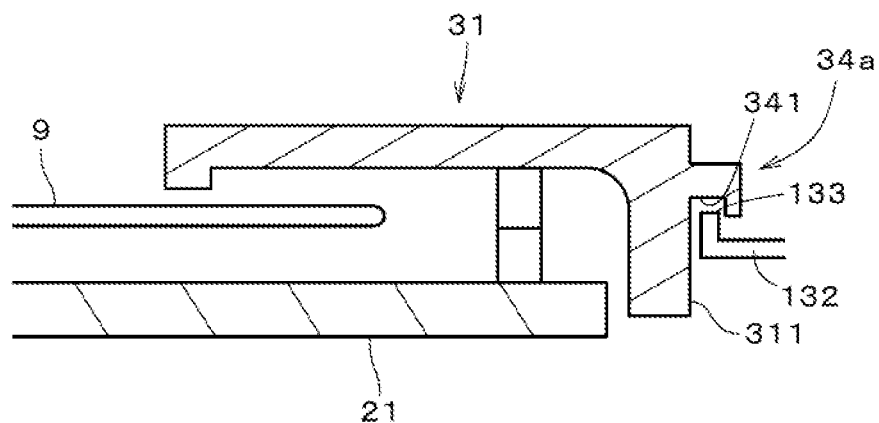
FIGS. 7A and 7B are views showing another example of a structure for moving the upper support body up and down.
Figure 7B:
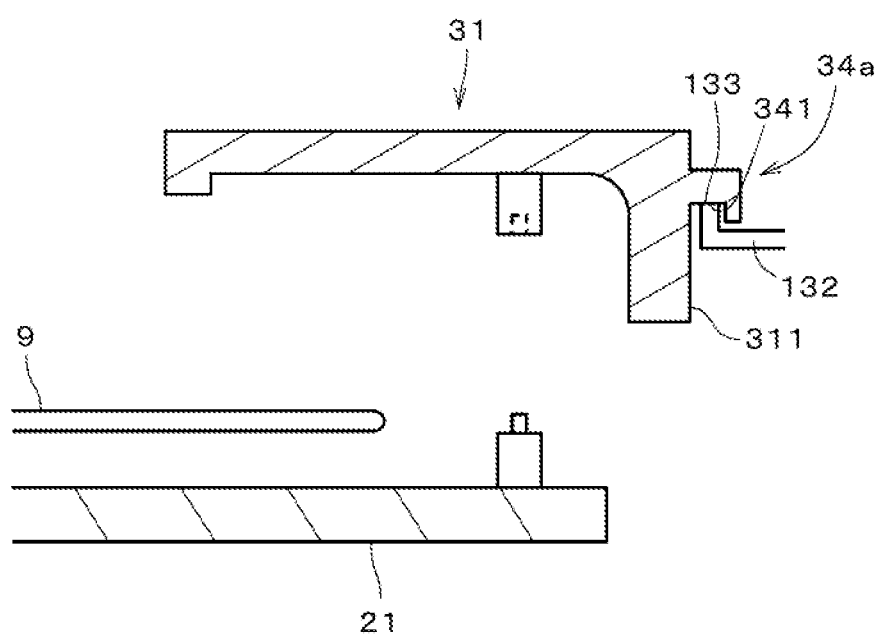

FIGS. 7A and 7B are views showing another example of a structure for moving the upper support body 31 up and down, corresponding to FIGS. 3A and 3B, respectively. FIG. 7A is a view showing a longitudinal section (however, only one side with respect to the central axis J1) of the upper support body 31 placed on the lower support body 21. FIG. 7B is a longitudinal section showing a state where the upper support body 31 is lifted from the lower support body 21 by the up-and-down moving part 13.

As shown in FIGS. 7A and 7B, an engagement part 34a protruding outward in the radial direction is provided on the outer peripheral surface of the upper support body 31 which is a placement member, along the entire circumference. An outer peripheral end of the engagement part 34a has a portion further protruding downward. The tip portion 132 of the up-and-down moving part 13 extends toward the outer peripheral surface of the upper support body 31 from outward in the radial direction below the engagement part 34a. A tip of the tip portion 132 has a portion protruding upward. As shown in FIG. 7B, when the tip portion 132 is moved up, the surface 341 facing downward inside, in the radial direction, a portion of the engagement part 34a protruding downward and the upper surface 133 of a portion of the tip portion 132 protruding upward come into contact with each other, to thereby separate the upper support body 31 upward from the lower support body 21. Hereinafter, the engagement part 34a is referred to as a "first contact part", the tip portion 132 is referred to as a "second contact part", the surface 341 is referred to as a "first contact surface", and the upper surface 133 is referred to as a "second contact surface".

When the second contact part 132 is moved down by the up-and-down-move driving part 131, as shown in FIG. 7A, the upper support body 31 is placed on the lower support body 21 and the second contact surface 133 is separated from the first contact surface 341. In other words, the second contact part 132 is separated from the first contact part 34a. Since the first contact part 34a is formed along the entire circumference, the lower support part 2 can be rotated in the state where the first contact part 34a and the second contact part 132 are separated from each other. Since the first contact surface 341 is an annular surface around the central axis J1, even if the rotation position of the upper support body 31 is any position, the upper support body 31 can be moved up and down by the up-and-down moving part 13.

Figure 8A:
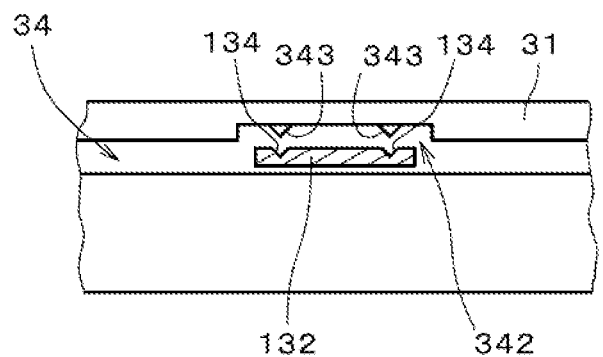
FIGS. 8A and 8B are views showing still another example of a structure for moving the upper support body up and down.
Figure 8B:
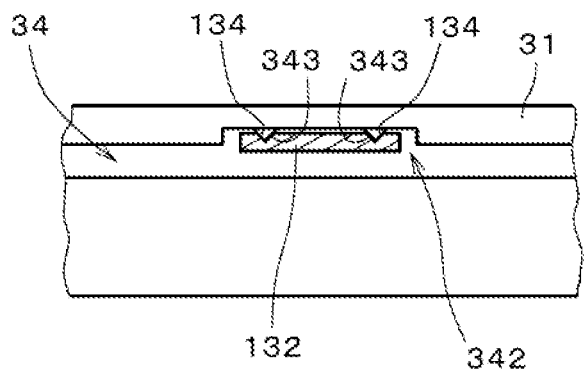

FIGS. 8A and 8B are views showing still another example of a structure for moving the upper support body 31 up and down, corresponding to FIGS. 3A and 3B, respectively. FIG.

8A is a view showing the upper support body 31 placed on the lower support body 21 (not shown) and the tip portion 132, viewed from the side of the up-and-down moving part 13. FIG. 8A shows a section of part of the outer peripheral surface of the upper support body 31 and the tip portion 132. FIG. 8B is a view showing the upper support body 31 and the tip portion 132 in the state where the upper support body 31 is lifted from the lower support body 21 by the up-and-down moving part 13, viewed from the side of the up-and-down moving part 13.

As shown in FIGS. 8A and 8B, the groove 34 recessed inward in the radial direction is provided on the outer peripheral surface of the upper support body 31 which is a placement member, along the entire circumference. Part of the groove 34 is an enlarged portion 342 broaden upward, and two protruding portions 343 protruding downward are provided on a surface of the enlarged portion facing downward, i.e., a sidewall of the upper side of the groove, which is enlarged. On the other hand, in the upper surface 133 of the tip portion 132 of the up-and-down moving part 13, provided are two recessed portions 134 recessed downward. Each protruding portion 343 has a substantially conical shape and each recessed portion 134 also has a substantially conical shape. Other constituent elements are identical to those of FIGS. 3A and 3B.

As shown in FIG. 8B, when the tip portion 132 is moved up, the protruding portions 343 of the enlarged portion 342 and the recessed portions 134 of the tip portion 132 are fitted to each other, and the upper support body 31 is separated upward from the lower support body 21. Hereinafter, the enlarged portion 342 is referred to as a "first contact part", the tip portion 132 is referred to as a "second contact part", the protruding portion 343 is referred to as a "first contact element", and the recessed portion 134 is referred to as a "second contact element".

When the second contact part 132 is moved down by the up-and-down-move driving part 131, the upper support body 31 is placed on the lower support body 21, and as shown in FIG. 8A, the second contact elements 134 and the first contact elements 343 are separated from each other. In other words, the second contact part 132 is separated from the first contact part 342. Further, since the second contact part 132 is positioned inside the groove 34 and the groove 34 is formed along the entire circumference, the lower support part 2 can be rotated in the state where the first contact part 342 and the second contact part 132 are separated from each other. When the rotation of the lower support body 21 and the upper support body 31 is stopped, the lower support body 21 is stopped at the rotation position where the position of the first contact part 342 and that of the second contact part 132 in the circumferential direction coincide with each other.

Since the first contact part 342 and the second contact part 132 include respective position deviation preventing structures which are fitted to each other when coming into contact with each other, i.e., the first contact elements 343 and the second contact elements 134, when the upper support body 31 is moved up, position deviation of the upper support body 31 with respect to the lower support body 21 is reliably prevented. Further, the number of the first contact elements 343 and the number of second contact elements 134 corresponding to one up-and-down moving part 13 may be each one. As a matter of course, the number of the first contact elements 343 and the number of second contact elements 134 corresponding to one up-and-down moving part 13 may be each three or more. As described earlier, since the plurality of up-and-down moving parts 13 are provided in the circumferential direction, a plurality of first contact elements 343 and a plurality of second contact elements 134 are arranged in the circumferential direction. The first contact elements 343 do not need to be arranged at regular intervals in the circumferential direction, and the second contact elements 134 do not need to be arranged at regular intervals in the circumferential direction.

Figure 9:
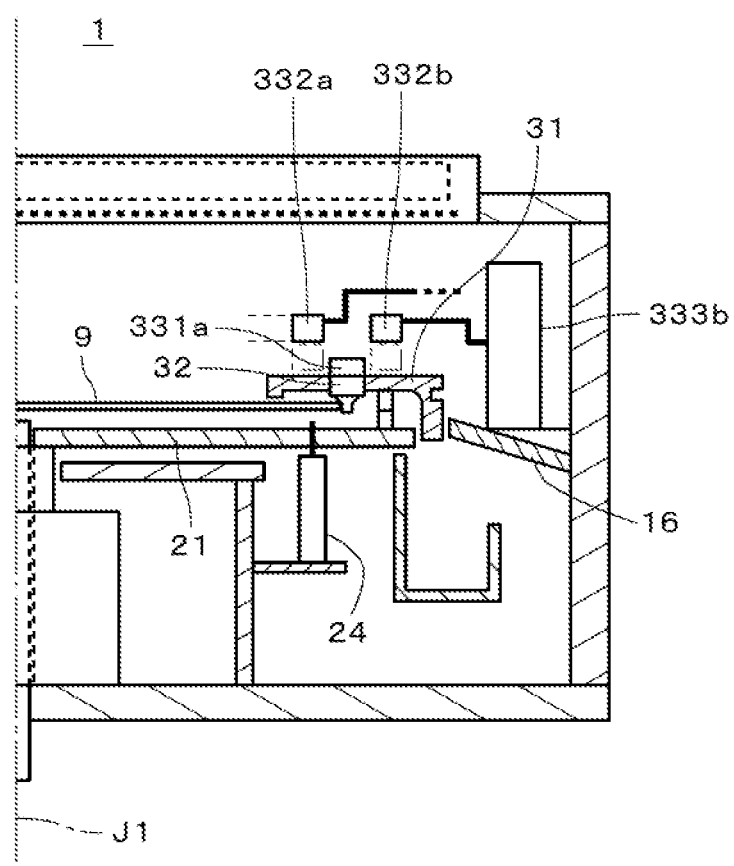
FIG. 9 is a longitudinal section showing the substrate processing apparatus in which a lower holding member is omitted.
Figure 10:
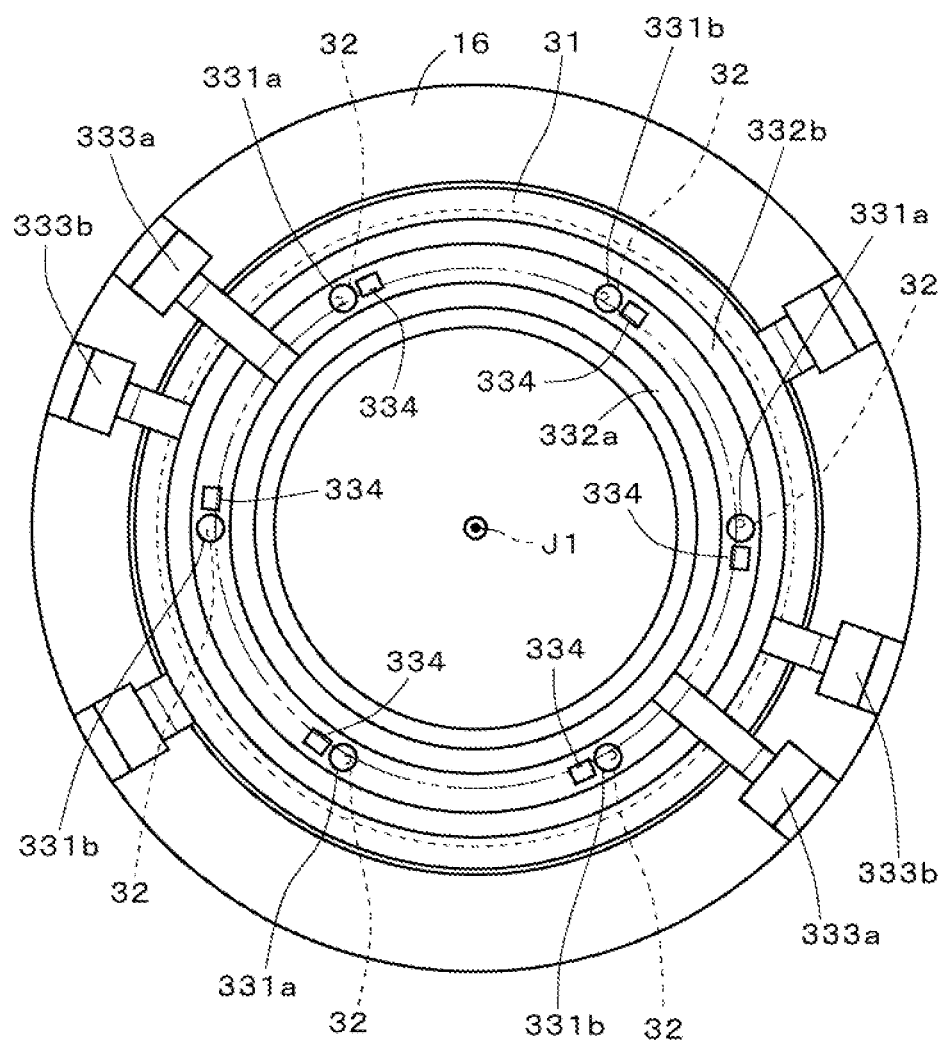
FIG. 10 is a plan view showing part of a configuration of the substrate processing apparatus of FIG. 9.

FIG. 9 is a longitudinal section showing part of the substrate processing apparatus 1 in which the lower holding members 22 are omitted. FIG. 10 is a plan view showing the annular cover 16 and part of its inside configuration in the substrate processing apparatus 1. As shown in FIG. 10, in the substrate processing apparatus 1, six upper holding members 32 are provided, and as the driving-side magnetic members, a first driving-side magnetic member 332a and a second driving-side magnetic member 332b are provided. The first driving-side magnetic member 332a has an annular shape around the central axis J1 and is positioned inside six holding-side magnetic members 331a and 331b in the radial direction. The second driving-side magnetic member 332b also has an annular shape around the central axis J1 and is positioned outside the six holding-side magnetic members 331a and 331b in the radial direction. The first driving-side magnetic member 332a is moved up and down by two magnetic member moving parts 333a. The second driving-side magnetic member 332b is moved up and down by two magnetic member moving parts 333b. The structure of the magnetic member moving parts 333a and 333b is the same as that of the magnetic member moving part 333 shown in FIGS. 1 and 2 except that respective positions of the driving-side magnetic members 332a and 332b are different from each other. In FIGS. 9 and 10, constituent elements identical to those in FIGS. 1 and 2 are represented by the same reference signs.

The three holding-side magnetic members 331a (hereinafter, referred to as "first holding-side magnetic members") and the three holding-side magnetic members 331b (hereinafter, referred to as "second holding-side magnetic members") are different in the magnetization state, and arranged alternately in the circumferential direction. As shown in FIG. 9, in a state where the first driving-side magnetic member 332a and the second driving-side magnetic member 332b are moved up, by the magnetic action between the first holding-side magnetic members 331a and the second holding-side magnetic members 331b and the position restoration parts 334, the six upper holding members 32 hold the substrate 9.

When the first driving-side magnetic member 332a is moved down by the magnetic member moving part 333a while the state where the second driving-side magnetic member 332b is moved up is kept, the magnetic action between each first holding-side magnetic member 331a and the first driving-side magnetic member 332a overcomes the magnetic action between the first holding-side magnetic member 331a and the position restoration part 334, the three upper holding members 32 connected to the first holding-side magnetic members 331a do not hold the substrate 9. At that time, the magnetic action between each second holding-side magnetic member 331b and the first driving-side magnetic member 332a is sufficiently smaller than the magnetic action between the second holding-side magnetic member 331b and the position restoration part 334 or acts on the holding direction, and the three upper holding members 32 connected to the second holding-side magnetic members 331b keep the state of holding the substrate 9.

When the second driving-side magnetic member 332b is moved down by the magnetic member moving part 333b while the state where the first driving-side magnetic member 332a is moved up is kept, the magnetic action between each second holding-side magnetic member 331b and the second driving-side magnetic member 332b overcomes the magnetic action between the second holding-side magnetic member 331b and the position restoration part 334, and the three upper holding members 32 connected to the second holding-side magnetic members 331b do not hold the substrate 9. At that time, the magnetic action between each first holding-side magnetic member 331a and the second driving-side magnetic member 332b is sufficiently smaller than the magnetic action between the first holding-side magnetic member 331a and the position restoration part 334 or acts on the holding direction, and the three upper holding members 32 connected to the first holding-side magnetic members 331a keep the state of holding the substrate 9.

Further, when the substrate 9 is loaded, in a state where the upper support body 31 is moved up, pins of a plurality of push-up mechanisms 24 (not shown in FIG. 2) arranged below the lower support body 21 are moved up through holes of the lower support body 21 and the substrate 9 is placed on the pins. Then, the upper support body 31 is moved down while the six upper holding members 32 keep the positions of not holding the substrate 9 by a not-shown mechanical mechanism, and the substrate 9 is held by the six upper holding members 32. The pins of the push-up mechanisms 24 are moved down.

After that, as described earlier, by supplying the processing liquid onto the upper surface and the lower surface of the substrate 9 while rotating the substrate 9, and alternately moving the above-described first driving-side magnetic member 332a and the second driving-side magnetic member 332b down, the holding-switch operation of the substrate 9 is performed. The unloading of the substrate 9 is a reverse operation of the loading of the substrate 9.

As described above, the substrate 9 may be held only by the upper holding members 32, and in this case, since no clash of the processing liquid supplied onto a (the) back surface of the substrate 9 against the lower holding members occurs, it is possible to reduce generation of the mist and droplets of the spattered processing liquid. As a result, it is possible improve the quality of the processing.

In the substrate processing apparatus 1 shown in FIGS. 9 and 10, the substrate 9 is supported by the upper support part 3. On the other hand, the upper support body 31 of the upper support part 3 is supported by the lower support part 2. Therefore, the substrate 9 is indirectly supported by the lower support part 2. In the substrate processing apparatus 1 shown in FIGS. 1 and 2, the substrate 9 is basically supported by the lower support part 2, but during the holding-switch operation, temporarily, the substrate 9 is indirectly supported by the lower support part 2. The configuration in which the substrate 9 is indirectly supported is not limited to the above-described configuration. There may be a configuration, for example, where a constituent element other than the upper support body 31 is placed on the lower support body 21 and the substrate 9 is supported by this constituent element. Further, though the upper support body 31 is an annular member and weight reduction of the upper support body 31 is thereby ensured in the substrate processing apparatus 1, from this point of view, it is not necessary to support the substrate 9 from above and the substrate 9 may be supported only by the lower support part 2. Specifically, the upper holding members 32 and the driving structure therefor may be omitted and the substrate 9 may be supported only by the lower holding members 22.

Further, supporting of the substrate 9 is not limited to holding by the upper holding members 32 and the lower holding members 22. For example, the substrate 9 may be supported by sucking the center of its lower surface or its outer peripheral portion. Even in a case where the substrate 9 is supported by any method, when the upper support body 31 is an annular member, it is possible to generate a desirable airflow at the outer edge portion of the upper surface of the substrate 9 while processing the substrate 9 being rotated. Further, the upper support body 31 has only to be an annular member and is not limited to being ring-shaped. Specifically, the outer periphery of the upper support body 31 or the inner periphery of the opening 313 is not limited to being circular.

As described earlier, in the substrate processing apparatus 1, by variously changing the longitudinal section shape of the upper support body 31, it is possible to easily obtain a desirable airflow at the outer edge portion of the substrate 9. The annular sidewall 311 of the upper support body 31 has only to be present on the side of the substrate 9 like a wall and does not need to have a wall-like shape. Specifically, the width of the annular sidewall 311 in the radial direction may be large and, for example, the width of the annular sidewall 311 in the radial direction may be larger than the height thereof in the axial direction. Further, an inner surface of the annular sidewall 311 is not limited to being a cylindrical surface, but may be provided with an annular recessed portion or protruding portion with the central axis J1 as the center.

The annular sidewall 311 has only to be opposed to the outer periphery of the substrate 9 supported by the lower support part 2 and the outer periphery of the lower support part 2 (more correctly, the outer periphery of the lower support body 21) in the radial direction. The annular sidewall 311, however, does not need to be opposed to the outer periphery of the lower support body 21 along the entire axial direction but the annular sidewall 311 has only to be present until the height of upper surface of the lower support body 21.

The annular upper portion 312 is not limited to having a plate-like shape. The annular upper portion 312 has only to extend from the annular sidewall 311 inward in the radial direction and to be opposed to the outer edge portion of the upper surface of the substrate 9 supported by the lower support part 2 in the up-and-down direction. Herein, the phrase "opposed to" means facing something without coming into contact therewith. In FIG. 3A, the annular upper portion 312 includes the annular protruding portion 314 protruding downward in the inner peripheral portion of the lower surface thereof, and the lower surface of the annular upper portion 312 may be provided with an annular recessed portion with the central axis J1 as the center, other than the annular protruding portion. Further, the lower surface of the annular upper portion 312 may be provided with two or more annular protruding portions or two or more annular recessed portions. In general expression, by providing the lower surface of the annular upper portion 312 with at least one of an annular protruding portion (projection), an annular recessed portion, and an annular step portion with the central axis J1 as the center, it is possible to make an airflow at the outer edge portion of the substrate 9 desirable. Furthermore, in general expression, the lower surface of the annular upper portion 312 in a longitudinal section does not need to be a straight line extending in a horizontal direction.

Preferably, the airflow generation part 111 generates an airflow directly downward toward the opening 313 of the annular upper portion 312. As described earlier, the airflow generation part 111 does not need to be entirely opposed to the opening 313 in the up-and-down direction but may be partially opposed. Preferably, the airflow generation part 111 should be directly opposed to not less than one-third of the opening in the up-and-down direction. More preferably, the airflow generation part 111 should be directly opposed to not less than a half of the opening in the up-and-down direction. If the airflow flowing in the opening 313 increases as compared with the case where the airflow generation part 111 is not present, the airflow may indirectly flow in the opening 313 from the airflow generation part 111.

The technique for making the airflow at the outer edge portion of the substrate 9 desirable is particularly suitable for the technique for guiding an etching solution to the outer edge portion of the substrate 9. Further, the technique is suitable for a case where an etching solution is supplied onto the lower surface of the substrate 9 and the etching solution is guided to an area including the outer edge portion of the upper surface of the substrate 9.

In a case where the liquid spattered from the substrate 9 can be sufficiently received by the upper support body 31, the annular cover 16 may be omitted. Conversely, a plurality of annular covers 16 may be provided in multiple ways in the radial direction. Further, the annular cover 16 may be moved up and down like a cover (a so-called cup) which directly receives the droplets from the substrate 9. Preferably, the upper portion of the annular cover 16 gets closer to the outer peripheral surface of the annular sidewall 311 while going inward in the radial direction, but the upper portion of the annular cover 16 may be positioned above the upper end of the annular sidewall 311. In the substrate processing apparatus 1, since generation of the mist and droplets of the processing liquid can be suppressed by providing the upper support body 31, it is possible to reduce the amount of airflow from the airflow generation part 111 and the amount of gas exhausted from the exhaust part provided at a lower portion of the apparatus. With size reduction of the annular cover 16 and reduction in the amount of airflow, it is possible to reduce the manufacturing cost of the substrate processing apparatus 1.

Figure 11:
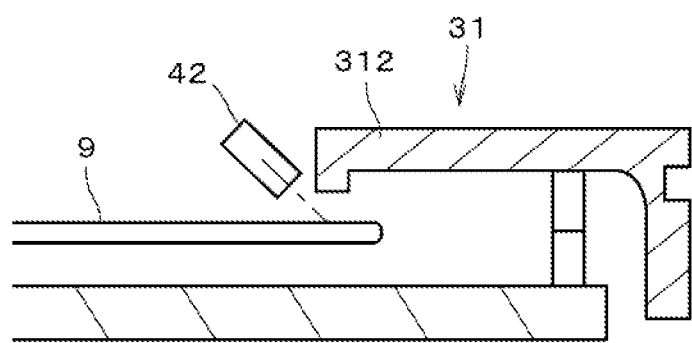
FIG. 11 is a view showing an ejection direction of a processing liquid from an upper nozzle.

Since the annular upper portion 312 has the large opening 313, it is possible to directly supply the processing liquid onto the upper surface at the outer edge portion of the substrate 9 from the upper nozzle 42. The upper nozzle 42 of the processing liquid supply part 4 may supply the processing liquid to a position nearer to the inner peripheral end (i.e., an edge of the opening 313) of the annular upper portion 312 than the central axis J1, and as shown in FIG. 11, by inclining the ejection direction of the processing liquid from the upper nozzle 42, the processing liquid may be supplied onto the upper surface of the substrate 9 at a position where the annular upper portion 312 and the substrate 9 overlap each other in the up-and-down direction. The processing liquid ejected from the upper nozzle 42 may be any of various processing liquids. The processing liquid may be a rinse liquid or an etching solution.

In the substrate processing apparatus 1, in the upper hold-driving part 33, each holding-side magnetic member 331 is mechanically connected to the upper holding member 32. The phrase "mechanically connected" means that the movement of the holding-side magnetic member 331 is transmitted to the upper holding member 32 directly or through a member in contact therewith. The holding-side magnetic member 331 is not limited to being directly joined to the upper holding member 32 as shown in FIG. 1, but the movement of the holding-side magnetic member 331 may be transmitted to the upper holding member 32 through a gear, a belt, a cam, a lever, or the like. The same applies to the holding-side magnetic member 231 of the lower hold-driving part 23 and the lower holding member 22.

Various manners of magnetization of the holding-side magnetic member 331 and the driving-side magnetic member 332 can be used. An N pole (or S pole) and an S pole (or N pole) may be present inside and outside the annular driving-side magnetic member 332 with the central axis J1 as its center, and an N pole (or S pole) and an S pole (or N pole) may be present above and below the driving-side magnetic member 332. Instead of moving the driving-side magnetic member 332 up and down, the magnetic member moving part 333 may move the driving-side magnetic member 332 in any other direction. There may be a configuration, for example, where the driving-side magnetic member 332 is divided into four pieces in the circumferential direction and the magnetic member moving part 333 moves each magnetic piece to and fro in the radial direction, to thereby cause the magnetic piece to get closer to or to be separated from the side of or above the holding-side magnetic member 331. As to the above description except that the up-and-down direction is reversed, the same applies to the lower hold-driving part 23.

As described earlier, at least one of each holding-side magnetic member 331 and the driving-side magnetic member 332 is a magnet. In terms of gaining a large attractive force and a large repulsive force, preferably, the holding-side magnetic member 331 and the driving-side magnetic member 332 are magnets. As described earlier, each position restoration part 334 may be a magnet, may be a magnetic material instead of a magnet, or may be an elastic body such as a coil spring, a leaf spring, or the like. The position restoration parts 334 may be omitted. The same applies to the lower hold-driving part 23. By using magnets, it is possible to easily move the upper holding members 32 and the lower holding members 22.

The upper holding member 32 is not limited to a member which is rotated around an axis oriented in the up-and-down direction. By being rotated around an axis oriented in the horizontal direction, for example, the upper holding member 32 may hold the outer edge portion of the substrate 9. The same applies to the lower holding member 22.

When the substrate 9 is processed, the holding-switch operation of the substrate 9 by using different holding members does not necessarily need to be performed.

In the substrate processing apparatus 1, the upper holding member 32 or the lower holding member 22 may be moved (including "rotated") by transmission of mechanical force, e.g., transmission through a gear, a belt, a cam, a lever, or the like, instead of using any magnet. Specifically, the upper holding member 32 or the lower holding member 22 may be moved between the position of holding the substrate 9 and the position of not holding the substrate 9 by transmission of the force using a contact of the members. There may be a configuration, for example, where the upper holding member 32 or the lower holding member 22 holds the substrate 9 by using a force of a spring or the like and in a still state, each come into contact with a drive mechanism which is separately provided, to thereby move to the position of not holding the substrate 9. Also in such a case, the holding-switch operation of the substrate 9 may be or may not be performed.

In terms of supporting the substrate 9 from above and reducing the spatter of the processing liquid flowing on the back surface of the substrate 9, the upper support body 31 may not have the opening 313. Further, in a case where it is not necessary to receive the processing liquid by the upper support body 31, it is not necessary to provide the annular sidewall 311 in the upper support body 31. In this case, the processing liquid spattered from the substrate 9 can be received, for example, by an annular cup disposed on the outer periphery of the lower support body 21 and the substrate 9. The annular upper portion 312 does not need to have a plate-like shape.

In terms of reducing the number of lower holding members 22 by providing the upper holding members 32, regardless of the presence or absence of the lower holding members 22, the configuration where the upper holding members 32 are provided in the upper support body 31 is particularly suitable for a case where the processing liquid is supplied onto the lower surface of the substrate 9.

Further, in the case where the upper hold-driving part 33 is provided, it requires a large force for moving the upper support body 31 up and down. Therefore, it is preferable that the upper support body 31 should be an annular member and weight reduction of the upper support body 31 should be thereby ensured. Furthermore, in terms of weight reduction, it is preferable that the upper support body 31 should be formed of a resin (e.g., PEEK (polyether ether ketone) resin).

In the substrate processing apparatus 1, the upper support body 31 is moved up and down while an outer edge portion of the upper support body 31 is supported. It is thereby possible to move the upper support body 31 which is a placement member for the lower support body 21 up and down with a simple structure and use a space above the substrate 9 for various uses. From this point of view, the upper support body 31 does not necessarily need to have the opening 313. Specifically, the upper support body 31 is separably placed on the lower support part 2 and covers at least over the outer edge portion of the substrate 9 supported by the lower support part 2. In the substrate processing apparatus 1, the processing liquid is supplied onto the upper surface or the lower surface of the substrate 9 supported by the lower support part 2. As a matter of course, in the case where the upper support body 31 is moved up and down with its outer edge portion supported, since the space above the upper support body 31 can be effectively used, it is preferable that the upper support body 31 which is a placement member should be made annular and the processing liquid or gas can be supplied onto the substrate 9 from above. Further, the substrate 9 may be held only by the lower holding members 22. In other words, the upper holding members 32 and the upper hold-driving part 33 may be omitted.

The number of up-and-down moving parts 13 for moving the upper support body 31 which is a placement member up and down relative to the lower support part 2 is preferably two or more. The number of up-and-down moving parts 13, however, may be one. By fitting both arms of a member having a large U shape and high rigidity in a plan view to the groove 34, for example, the upper support body 31 may be moved up and down by one up-and-down moving part 13. Both in the case where the number of up-and-down moving parts 13 is one and in the case where the number is two or more, in general expression, the upper support body 31 includes the first contact part which can come into contact with the up-and-down moving part 13 in the up-and-down direction outside the outer periphery of the substrate 9 supported by the lower support part 2 in the radial direction and the up-and-down moving part 13 includes the second contact part extending toward the first contact part of the upper support body 31 from outward in the radial direction. Then, when the up-and-down-move driving part 131 moves the second contact part up, the second contact part comes into contact with the first contact part and the upper support body 31 is separated upward from the lower support part 2, and when the up-and-down-move driving part 131 moves the second contact part down, the upper support body 31 is placed on the lower support part 2 and the second contact part is separated from the first contact part.

After the upper support body 31 is placed on the lower support part 2, though the second contact part may be retracted outward in the radial direction, preferably, the lower support part 2 and the upper support part 3 can be rotated in a state where the first contact part and the second contact part are separated from each other, without retraction of the second contact part. It is thereby possible to move the upper support body 31 up and down with a simple structure. Especially, when the first contact part comes into contact with the second contact part, the annular surface with the central axis J1 as its center included in the first contact part comes into contact with the second contact part, and the upper support body 31 can be thereby moved up and down, regardless of the position of the upper support body 31 in a rotation direction. Usually, when the first contact part and the second contact part come into contact with each other, the annular surface of the upper support body 31, facing downward, comes into contact with the surface of the up-and-down moving part 13, facing upward. These surfaces, however, are not limited to horizontal surfaces. For example, an annular surface protruding downward is provided on the upper support body 31 and a surface recessed downward is provided on the up-and-down moving part 13, and these surfaces may come into contact with each other.

On the other hand, in a case where the position of rotation by the rotating part 12 can be controlled, the upper support body 31 can be provided with the first contact part partially in the circumferential direction. In this case, as shown in FIGS. 8A and 8B, the position deviation preventing structures which are fitted to each other when coming into contact with each other can be easily included in the first contact part and the second contact part, respectively. The position deviation preventing structures preferably serve to prevent position deviation of the upper support body 31 relative to the lower support body 21 in the circumferential direction and that in the radial direction. The position deviation preventing structures may serve to prevent only the position deviation in the radial direction. In a case, for example, where the upper holding members 32 are not provided on the upper support body 31 and the upper support body 31 can be placed on the lower support body 21 at any rotation position, the position deviation has only to be prevented only in the radial direction. The prevention of position deviation can be achieved when the protruding portion, the recessed portion, the step portion, or the like provided on at least one of the first contact part and the second contact part is fitted to part of the other.

In the substrate processing apparatus 1, provided is the annular cover 16 which is disposed outside the upper support body 31 in the radial direction in a still state, and by providing the up-and-down-move driving part 131 on the annular cover 16, size reduction of the substrate processing apparatus 1 is achieved. When the annular cover 16 has sufficient rigidity, the up-and-down-move driving part 131 may be set directly on the annular cover 16. When the annular cover 16 does not have sufficient rigidity, there may be a configuration where a reinforcing member is provided on the annular cover 16 and the up-and-down moving part 13 is set on the annular cover 16. Further, there may be another configuration where a base such as a frame or the like having high rigidity is provided above the annular cover 16 and the up-and-down moving part 13 is set thereon. Specifically, the phrase "the up-and-down-move driving part 131 is provided on the annular cover 16" includes a case where the up-and-down-move driving part 131 is provided above the annular cover 16, in terms of reduction in the footprint of the substrate processing apparatus 1. The same applies to a case where a mechanism for retracting the magnetic member moving part 333 of the upper hold-driving part 33 and the upper nozzle 42 is provided on the annular cover 16.

Regardless of the presence or absence of the opening 313 of the upper support body 31 or the presence or absence of the upper holding members 32, the phrase "the upper support body 31 is separably placed on the lower support body 21 (lower support part 2)" preferably means that the upper support body 31 should be separably placed on the lower support body 21 by moving the upper support body 31 in the up-and-down direction. As a matter of course, the upper support body 31 may be separably placed on the lower support body 21 by moving the upper support body 31 any direction other than the up-and-down direction. The phrase "separably placed" means the upper support body 31 is engaged on the lower support body 21 by mainly using the gravity (or by using only the gravity).

The rotating part 12 of the substrate processing apparatus 1 is preferably a hollow motor as described earlier, but when it is not necessary to provide the lower nozzle 41, no through hole needs to be formed in the rotation axis. Further, the rotating part 12 may be a motor in which a rotor floats with respect to a stator.

The above-described substrate processing apparatus 1 may be used for processing a glass substrate, other than the semiconductor substrate, which is used in a flat panel display such as a liquid crystal display, an organic EL (Electro Luminescence) display, or the like, or a glass substrate used in any other display device. Further, the above-described substrate processing apparatus 1 may be used for processing a substrate for optical disk, a substrate for magnetic disk, a substrate for magneto-optic disk, a substrate for photomask, a ceramic substrate, a substrate for solar battery, and the like.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
2 Lower support part
4 Processing liquid supply part
9 Substrate
12 Rotating part
13 Up-and-down moving part
16 Annular cover
21 Lower support body
31 Upper support body (placement member)
34 Groove (which is a first contact part)
34a Engagement part (which is a first contact part)
131 Up-and-down-move driving part
132 Tip portion (which is a second contact part)
134 Recessed portion (which is part of a position deviation preventing structure)
342 Enlarged portion (which is a first contact part)
343 Protruding portion (which is part of a position deviation preventing structure)

The invention claimed is:

1. A substrate processing apparatus for supplying a processing liquid onto a substrate to process said substrate, comprising:
   a support part for directly or indirectly supporting the substrate in a horizontal position;
   a rotating part for rotating said support part around a central axis oriented in an up-and-down direction;
   a placement member which is separably placed on said support part and covers above at least an outer edge portion of said substrate supported by said support part;
   an up-and-down moving part for moving said placement member up and down relative to said support part; and
   a processing liquid supply part for supplying a processing liquid onto an upper surface or a lower surface of said substrate supported by said support part,
   wherein said placement member includes a first contact part which is contactable with said up-and-down moving part in the up-and-down direction outside an outer periphery of said substrate supported by said support part in a radial direction,
   said up-and-down moving part includes a second contact part extending toward said first contact part of said placement member from an outward portion in the radial direction and an up-and-down-move driving part for moving said second contact part up and down,
   when said second contact part is moved up by said up-and-down-move driving part, said second contact part comes into contact with said first contact part to separate said placement member upward from said support part,
   when said second contact part is moved down by said up-and-down-move driving part, said placement member is placed on said support part to separate said second contact part from said first contact part, and
   said support part is rotatable in a state where said first contact part and said second contact part are separated from each other.

2. The substrate processing apparatus according to claim 1, wherein
   a position of said first contact part in a height direction is not higher than 150 mm from an upper surface of said support part in a state where said placement member is placed on said support part.

3. The substrate processing apparatus according to claim 1, wherein
   said placement member has an annular shape.

4. The substrate processing apparatus according to claim 1, wherein
   said first contact part and said second contact part include position deviation preventing structures which are fitted to each other when these come into contact with each other.

5. The substrate processing apparatus according to claim 1, wherein
   when said first contact part comes into contact with said second contact part, an annular surface of said first contact part around said central axis comes into contact with said second contact part.

6. The substrate processing apparatus according to claim 1, further comprising:
   an annular cover disposed outside said placement member in the radial direction in a still state, wherein an upper portion of said annular cover gets closer to an outer peripheral surface of said placement member while going inward in the radial direction, and said up-and-down-move driving part is provided on said annular cover.

7. A substrate processing apparatus for supplying a processing liquid onto a substrate to process said substrate, comprising:
- a supporter for directly or indirectly supporting the substrate in a horizontal position;
- a rotator for rotating said supporter around a central axis oriented in an up-and-down direction;
- a substrate cover which is separably placed on said supporter and covers above at least an outer edge portion of said substrate supported by said supporter;
- an elevator for moving said substrate cover up and down relative to said supporter; and
- a nozzle for supplying a processing liquid onto an upper surface or a lower surface of said substrate supported by said supporter,
- wherein said substrate cover includes a first contact part which is contactable with said elevator in the up-and-down direction outside an outer periphery of said substrate supported by said supporter in a radial direction,
- said elevator includes a second contact part extending toward said first contact part of said substrate cover from an outward portion in the radial direction and an actuator for moving said second contact part up and down,
- when said second contact part is moved up by said actuator, said second contact part comes into contact with said first contact part to separate said substrate cover from said supporter,
- when said second contact part is moved down by said actuator, said substrate cover is placed on said supporter to separate said second contact part from said first contact part, and
- said supporter is rotatable in a state where said first contact part and said second contact part are separated from each other.

8. The substrate processing apparatus according to claim 7, wherein
a position of said first contact part in a height direction is not higher than 150 mm from an upper surface of said supporter in a state where said substrate cover is placed on said supporter.

9. The substrate processing apparatus according to claim 7, wherein
said substrate cover has an annular shape.

10. The substrate processing apparatus according to claim 7, wherein
said first contact part and said second contact part are fitted to each other to prevent position deviation when these come into contact with each other.

11. The substrate processing apparatus according to claim 7, wherein
when said first contact part comes into contact with said second contact part, an annular surface of said first contact part around said central axis comes into contact with said second contact part.

12. The substrate processing apparatus according to claim 7, further comprising:
an annular cover disposed outside said substrate cover in the radial direction in a still state,
wherein an upper portion of said annular cover gets closer to an outer peripheral surface of said substrate cover while going inward in the radial direction, and
said elevator is provided on said annular cover.

* * * * *